(12) United States Patent
Yao et al.

(10) Patent No.: US 11,798,910 B2
(45) Date of Patent: Oct. 24, 2023

(54) SELF-ALIGNED INTERCONNECT STRUCTURE

(71) Applicant: Taiwan Semiconductor Manufacturing Company, Ltd., Hsin-Chu (TW)

(72) Inventors: Hsin-Chieh Yao, Hsinchu (TW); Chung-Ju Lee, Hsinchu (TW); Chih Wei Lu, Hsinchu (TW); Hsi-Wen Tien, Xinfeng Township (TW); Yu-Teng Dai, New Taipei (TW); Wei-Hao Liao, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/868,946

(22) Filed: Jul. 20, 2022

(65) Prior Publication Data

US 2022/0352113 A1   Nov. 3, 2022

Related U.S. Application Data

(62) Division of application No. 16/898,670, filed on Jun. 11, 2020, now Pat. No. 11,488,926.

(51) Int. Cl.
*H01L 23/00* (2006.01)
*H01L 21/768* (2006.01)
*H01L 23/522* (2006.01)

(52) U.S. Cl.
CPC ........ *H01L 24/48* (2013.01); *H01L 21/76802* (2013.01); *H01L 21/76877* (2013.01);
(Continued)

(58) Field of Classification Search
CPC ............... H01L 24/48; H01L 21/76802; H01L 21/76816; H01L 21/76831;
(Continued)

(56) References Cited

U.S. PATENT DOCUMENTS 11,557,512 B2 *  1/2023  Wang ................ H01L 21/76831
2003/0139034 A1  7/2003  Yuang
(Continued)

OTHER PUBLICATIONS

A.J.M. Mackus, M.J.M. Merkx. Fully Self-Aligned Vias: The Killer Application for Area-Selective ALD?—A Discussion of the Requirements for Implementation in High Volume Manufacturing. 2019, 7. AtomicLimits, published on Jul. 18, 2019.
(Continued)

*Primary Examiner* — Thanh T Nguyen
(74) *Attorney, Agent, or Firm* — Eschweiler & Potashnik, LLC

(57) ABSTRACT

The present disclosure relates to a semiconductor structure including an interconnect structure disposed over a semiconductor substrate. A lower metal line is disposed at a first height over the semiconductor substrate and extends through a first interlayer dielectric layer. A second interlayer dielectric layer is disposed at a second height over the semiconductor substrate and comprises a first dielectric material. An upper metal line is disposed at a third height over the semiconductor substrate. A via is disposed at the second height. The via extends between the lower metal line and the upper metal line. A protective dielectric structure is disposed at the second height. The protective dielectric structure comprises a protective dielectric material and is disposed along a first set of opposing sidewalls of the via, the protective dielectric material differing from the first dielectric material.

20 Claims, 20 Drawing Sheets

(52) U.S. Cl.
CPC .. *H01L 21/76808* (2013.01); *H01L 21/76897* (2013.01); *H01L 23/5226* (2013.01)
(58) Field of Classification Search
CPC ............. H01L 21/76829; H01L 21/768; H01L 21/76819; H01L 21/7684; H01L 21/76841; H01L 21/76834; H01L 21/76843; H01L 21/76804; H01L 21/76877; H01L 21/76879; H01L 23/5328; H01L 23/5329; H01L 23/53295; H01L 23/5226; H01L 23/522
See application file for complete search history.

(56) References Cited

U.S. PATENT DOCUMENTS

| | | | |
|---|---|---|---|
| 2003/0186538 | A1 | 10/2003 | Lee et al. |
| 2010/0314777 | A1* | 12/2010 | Oda ................... H01L 23/53295 |
| | | | 257/E21.585 |
| 2016/0379925 | A1* | 12/2016 | Ok .................... H01L 21/76897 |
| | | | 438/666 |
| 2017/0110569 | A1* | 4/2017 | Chang ............... H01L 21/76897 |
| 2018/0151445 | A1* | 5/2018 | Hsu ..................... H01L 21/0217 |
| 2019/0296124 | A1* | 9/2019 | Hsu ................... H01L 21/31105 |

OTHER PUBLICATIONS

Non-Final Office Action dated Dec. 7, 2021 for U.S. Appl. No. 16/898,670.

Notice of Allowance dated Jun. 14, 2022 for U.S. Appl. No. 16/898,670.

* cited by examiner

SELF-ALIGNED INTERCONNECT STRUCTURE

REFERENCE TO RELATED APPLICATION

This Application is a Divisional of U.S. application Ser. No. 16/898,670, filed on Jun. 11, 2020, the contents of which are hereby incorporated by reference in their entirety.

BACKGROUND

Modern day integrated chips contain millions of semiconductor devices, such as active semiconductor devices (e.g., transistors) and/or passive semiconductor devices (e.g., resistors, diodes, capacitors). The semiconductor devices are electrically interconnected by way of back-end-of-the-line (BEOL) metal interconnect layers that are formed above the semiconductor devices on an integrated chip. A typical integrated chip comprises a plurality of back-end-of-the-line metal interconnect layers including different sized metal wires vertically coupled together with metal contacts (i.e., vias).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
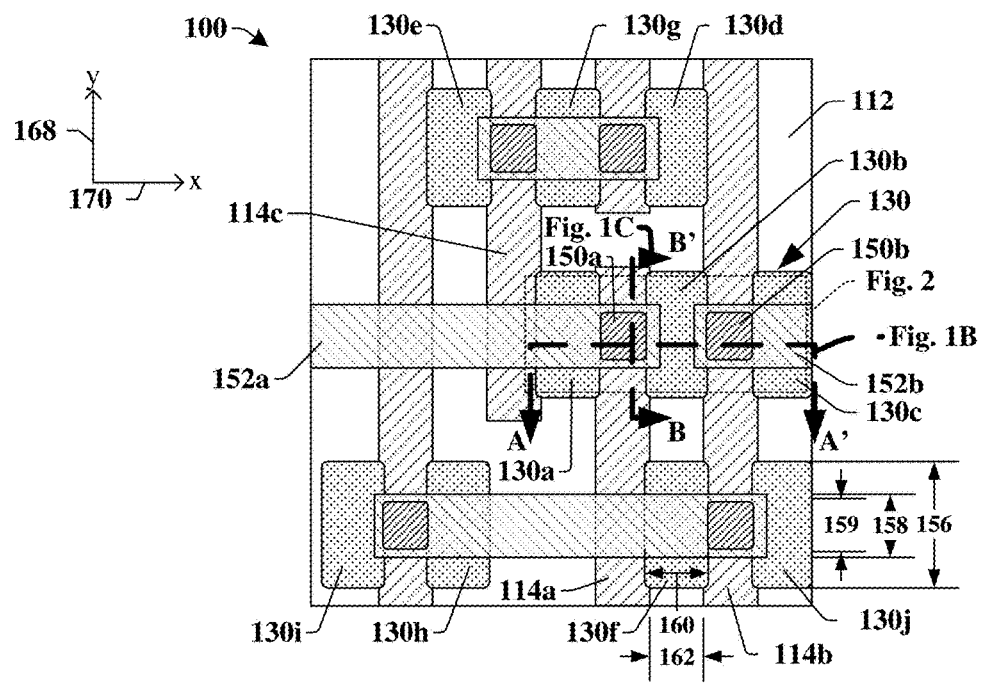
FIG. 1A illustrates a top layout view of some embodiments of an integrated chip comprising a self-aligned interconnect structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many integrated chips include semiconductor devices disposed on a semiconductor substrate. The semiconductor devices are typically connected to one another by an interconnect structure disposed over the semiconductor substrate. The interconnect structure may include a plurality of lower metal lines laterally spaced apart by a first interlayer dielectric (ILD) layer. A plurality of upper metal lines may be disposed over the lower metal lines and laterally spaced apart by a second ILD layer. Conductive contacts may couple the lower metal lines to the semiconductor devices on the semiconductor substrate, and conductive vias may extend through the second ILD layer to vertically couple to the lower metal lines to the upper metal lines. In this way, the interconnect structure can couple the devices to one another to achieve a predetermined circuit configuration, such as a microprocessor, application specific integrated circuit (ASIC), memory device, image sensor device, and the like.

A challenge with some interconnect structures arises due to misalignment that occurs during manufacturing. More particularly, to manufacture such an interconnect structure, the lower metal lines are formed, and the second ILD layer is formed over the lower metal lines. Then, a mask is patterned over the second ILD layer, and an etch is carried out with the mask in place to form via openings that extend downwardly through the second ILD layer to upper surfaces of the lower metal lines. Metal is then deposited in these via openings, thereby establishing the vias of the interconnect structure. Ideally, each via would be centered directly over its corresponding lower metal line, such that sidewalls of the via reside entirely over an upper surface of the lower metal line (e.g., sidewalls of the via would not overhang the outer edges of the lower metal line). However, due to slight misalignment of the mask during processing, in reality the via openings may be laterally shifted slightly from their ideal positions and the actual via openings may have outer edges that extend laterally past (and downward alongside) the outer sidewalls of the lower metal lines. Consequently, when the metal is subsequently formed in the via openings, the metal may also extend laterally beyond (and downward alongside) the sidewalls of the lower metal lines, thereby reducing the effective distance/separation between adjacent lower metal lines. In some scenarios, this metal can form an unexpected conductive "bridge" between two adjacent lower metal lines that would otherwise be isolated from one another, such that this "bridge" leads to an unexpected short circuit that is detrimental (or fatal) to the final chip. In other cases, this metal can simply reduce the distance between the two adjacent lower metal lines, thereby allowing for increased current leakage between the two adjacent lower metal lines, which can lead to reduced performance and/or cause long-term reliability concerns.

Accordingly, various embodiments of the present disclosure relate to an integrated chip comprising a self-aligned interconnect structure for improving the reliability of the integrated chip and a method for forming the self-aligned interconnect structure. The self-aligned interconnect structure may comprise a plurality of lower metal lines within a first interlayer dielectric (ILD) layer, a plurality of upper metal lines within a second ILD layer, and a plurality of vias disposed between the plurality of lower metal lines and the plurality of upper metal lines. A protective dielectric structure is disposed along sidewalls of the plurality of vias. The protective dielectric structure may further electrically isolate vias and underlying neighboring metal lines to limit current leakage and to limit unwanted short circuits from occurring between the vias and neighboring metal lines. Thus, the self-aligned interconnect structure increases the performance and reliability of the integrated chip.

Figures 1B, 1C:
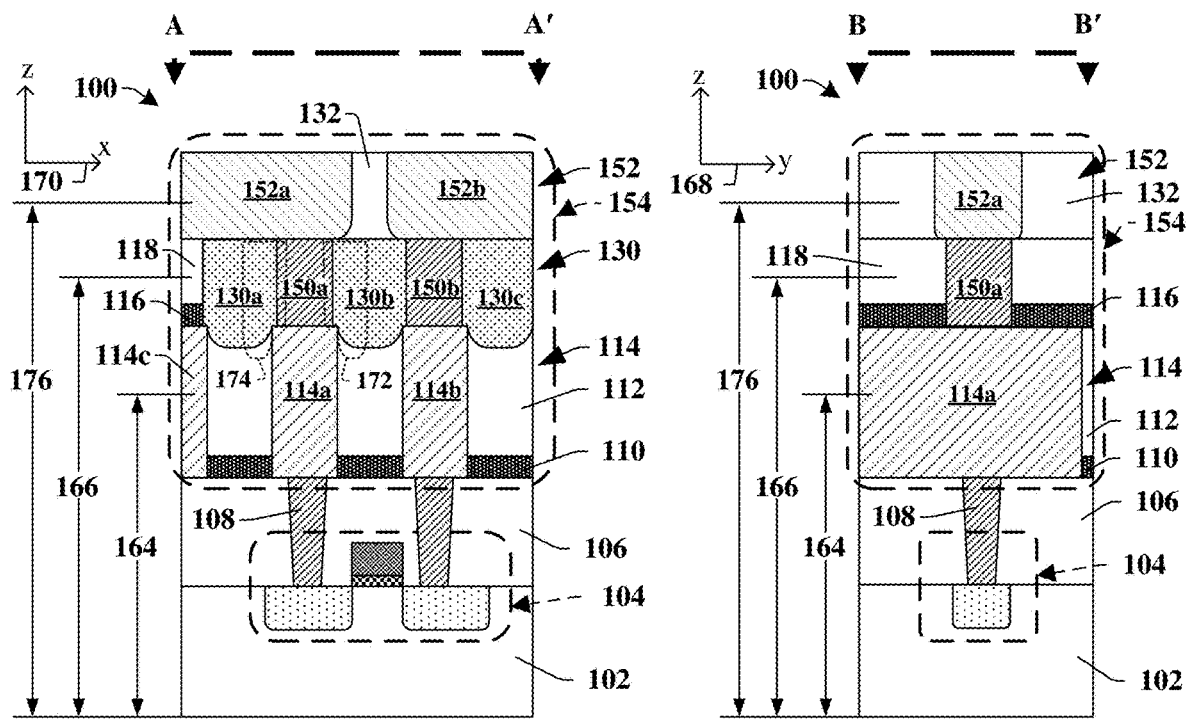
FIG. 1B illustrates a cross-sectional view of some embodiments of the integrated chip of FIG. 1A in a first direction.
FIG. 1C illustrates a cross-sectional view of some embodiments of the integrated chip of FIG. 1A in a second direction.

FIG. 1A illustrates a top layout view of some embodiments of an integrated chip 100 including a self-aligned interconnect structure, and FIGS. 1B-1C illustrate cross-sectional views of the integrated chip 100 and the self-aligned interconnect structure 154 consistent with some embodiments of FIG. 1A. The integrated chip may also be referred to as a semiconductor structure.

Referring now to FIGS. 1A, 1B, and 1C concurrently, one can see that the self-aligned interconnect structure 154 includes a plurality of metal layers and a plurality of dielectric layers disposed over a semiconductor substrate 102. More particularly, a first interlayer dielectric (ILD) layer 112 may be disposed over the semiconductor substrate 102 at a first height 164. A plurality of lower metal lines 114, such as metal-1 lines for example, may extend through the first ILD layer 112 at the first height 164. The plurality of lower metal lines 114 may include a first lower metal line 114a, a second lower metal line 114b, and a third lower metal line 114c, which extend in a first direction in parallel with a first axis 168. A second ILD layer 118 may be disposed over the semiconductor substrate 102 at a second height 166 that is greater than the first height 164. A third ILD layer 132 may be disposed over the semiconductor substrate 102 at a third height 176 that is greater than the second height 166. A plurality of upper metal lines 152, such as metal-2 lines for example, may extend through the third ILD layer 132 at the third height 176. The plurality of upper metal lines 152 may include a first upper metal line 152a and a second upper metal line 152b, which extend in a second direction in parallel with a second axis 170 perpendicular to the first axis 168. Contacts (e.g., 108) may extend through dielectric layer 106 to connect the lower metal lines 114 to device structures 104, and vias (e.g., 150a, 150b) may electrically connect the lower metal lines 114 to the upper metal lines 152. For example, a first via 150a may connect the first lower metal line 114a to the first upper metal line 152a, and a second via 150b may connect the second lower metal line 114b to the second upper metal line 152b. The vias (e.g., 150a, 150b) may be disposed at the second height 166 and may extend through the second ILD layer 118. A first etch stop layer 110 and second etch stop layer 116 may also be present.

Some aspects of this disclosure appreciate that if a via, such as first via 150a were misaligned, issues could arise. For example, if the first via 150a were misaligned to the right in FIG. 1B (see 172), the misaligned via 172 (or "tiger tooth") could cause first metal line 114a and/or first upper metal line 152a to experience increased current leakage with respect to second lower metal line 114b and/or second upper metal line 152b, or could potentially even cause an unexpected conductive bridge to form between first lower metal line 114a and second lower metal line 114b for example. Similarly, if the first via 150a were misaligned to the left in FIG. 1B (see 174), the misaligned via 174 (or "tiger tooth") could cause first lower metal line 114a and/or first upper metal line 152a to experience increased current leakage with respect to third lower metal line 114c, or could potentially even cause an unexpected conductive bridge to form between first lower metal line 114a and third lower metal line 114c, for example.

Therefore, to limit the effects of such misalignment, the self-aligned interconnect structure 154 includes a protective dielectric structure 130. The protective dielectric structure 130 may be disposed at the second height 166 and may extend through the second ILD layer 118 into a top portion of the first ILD layer 112. The protective dielectric structure 130 in FIGS. 1A-1C includes a "stripe" layout when viewed from above, and helps limit the via misalignment. The material of the protective dielectric structure 130 may have a lower etch rate than that of the first ILD layer 112 and second ILD layer 118 with respect to the etchant used to form an opening for the first via 150a and second via 150b. Thus, by having the protective dielectric structure 130 disposed along sidewalls of the first via 150a and second via 150b, over-etch regions may be eliminated and thus, a potential for current leakage or short circuits to occur between electrically isolated vias and lower metal lines may be decreased. As a result, the overall performance and reliability of the integrated circuit may be increased.

In the embodiment of FIG. 1A-1C, the protective dielectric structure 130 may be disposed on two opposite sides of the first via 150a (see FIG. 1B) but not on the other two sides of the first via 150a (see FIG. 1C). Thus, a first protective dielectric structure 130a and a second protective dielectric structure 130b may be symmetric about the first lower metal line 114a with respect to the first axis 168. The protective dielectric structure 130 may have a length 156 in the first direction 168, and a width 160 in the second direction 170. The length 156 of the protective dielectric structure 130 may be greater than a width 158 of the upper metal lines 152, and greater than a width 159 of the vias (e.g., 150a, 150b). Having the length 156 of the protective dielectric structure 130 be greater than the width of the vias ensures that the outer sidewalls of the vias are completely covered by the protective dielectric structure 130 along the width 159 of the vias. The width 160 of the protective dielectric structure 130 may be greater than a distance 162 between neighboring lower metal lines (e.g., 114a, 114b). Having the width 160 of the protective dielectric structure 130 being greater than the distance 162 helps to reduce the chances of over-etch regions and/or "tiger tooth" from occurring.

In some embodiments, the semiconductor substrate 102 comprises silicon, any III-V semiconductor compound, any other suitable material, or any combination of the foregoing. In some embodiments, the device structure 104 comprises a transistor device. In some embodiments, dielectric layer 106 comprises silicon oxide, silicon nitride, a low-k dielectric, or any combination of the foregoing. In some embodiments, the contact 108 comprises copper, cobalt, tungsten, aluminum, titanium, or any combination of the foregoing.

In some embodiments, the first etch stop layer 110 and the second etch stop layer 116 comprise silicon carbide, silicon oxide, silicon oxycarbide, silicon nitride, silicon carbon nitride, silicon oxynitride, silicon oxycarbide nitride, aluminum oxynitride, aluminum oxide, any other suitable material, or any combination of the foregoing. The first etch stop layer 110 and the second etch stop layer 116 may have a thickness of about 10 to 1000 angstroms.

In some embodiments, any of the first ILD layer 112, the second ILD layer 118, and the third ILD layer 132 comprise a first dielectric material. The first dielectric material may comprise silicon carbide, silicon oxide, silicon oxycarbide, silicon nitride, silicon carbon nitride, silicon oxynitride, silicon oxycarbide nitride, any other suitable dielectric, a low-k dielectric, or any combination of the foregoing. The first ILD layer 112, the second ILD layer 118, and the third ILD layer 132 may each have a thickness of about 30 to 800 angstroms.

In some embodiments, the lower metal lines 114 comprise a first metal and the upper metal lines 152 comprise a second metal. The first metal and the second metal may each comprise tantalum, tantalum nitride, titanium nitride, copper, aluminum, cobalt, ruthenium, molybdenum, iridium, tungsten, or any combination of the foregoing. The lower metal lines 114 and the upper metal lines 152 may have a thickness of about 10 to 1000 angstroms.

In some embodiments, the protective dielectric structure 130 comprises a protective dielectric material. The protective dielectric material may comprise hafnium oxide, lithium niobium oxide, lithium nickel oxide, magnesium oxide, manganese oxide, molybdenum oxide, niobium oxide, nickel oxide, silicon oxide, silicon oxycarbide, silicon oxycarbide nitride, silicon carbide, tin oxide, tin silicon oxide, strontium oxide, tantalum pentoxide, tantalum oxynitride, tungsten oxide, zinc oxide, zirconium oxide, some other metal oxide, or any combination of the foregoing. The protective dielectric structure 130 may have a thickness of about 10 to 1000 angstroms.

In some embodiments, the vias (e.g., 150a, 150b) comprise tantalum, tantalum nitride, titanium nitride, copper, aluminum, cobalt, ruthenium, molybdenum, iridium, tungsten, or any combination of the foregoing. The via 150 may have a thickness of about 10 to 1000 angstroms.

Figure 1D:
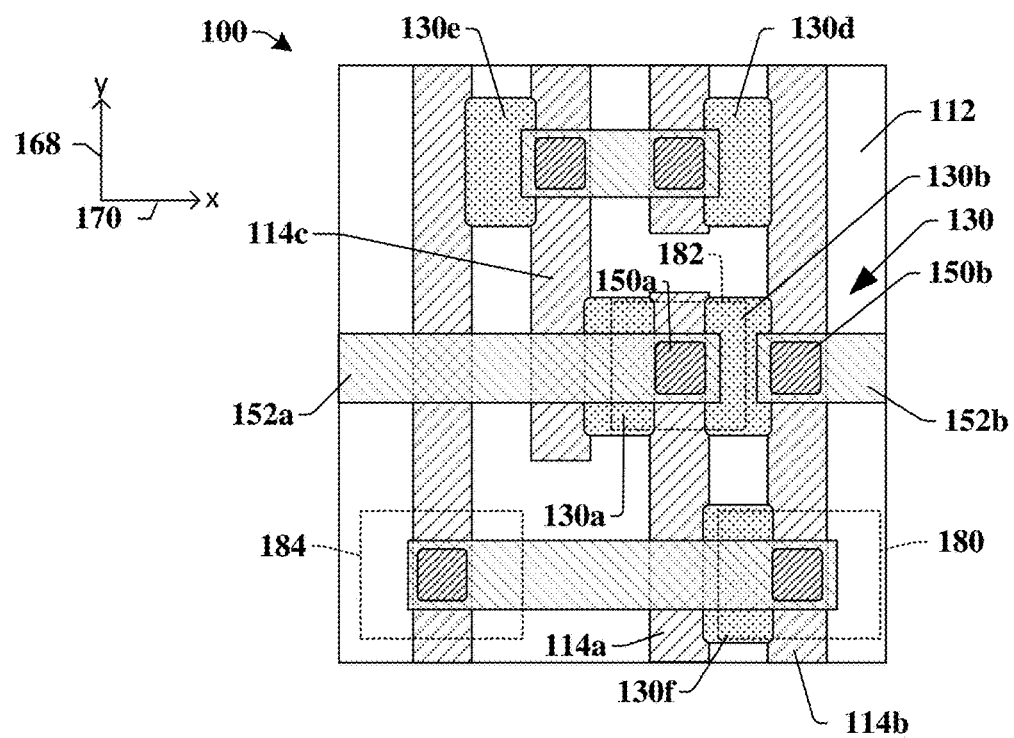
FIG. 1D illustrates an alternative top layout view of some embodiments of an integrated chip comprising a self-aligned interconnect structure.

It will be appreciated that although the top view of FIG. 1A shows the protective dielectric structure as being symmetrical on opposite sides of each via, other embodiments are also possible. For instance, in FIG. 1A, the protective dielectric structures disposed between neighboring lower metal lines (which are spaced apart at a regularly repeating pitch and are generally electrically isolated from one another) are particularly beneficial because they limit unexpected conductive bridges and current leakage that could otherwise occur because of via misalignment. Thus, in FIG. 1A, protective dielectric structures 130a, 130b, 130d, 130e, 130f are particularly beneficial in this regard. In contrast, because protective dielectric structures 130c, 130g, 130h, 130i, and 130j in FIG. 1A do not separate electrically isolated nearest neighboring lower metal lines from one another, these dielectric structures can be omitted in other embodiments, such as shown in FIG. 1D. Thus, in FIG. 1D, the protective dielectric structure can be asymmetric on opposite sides of a via (see e.g., 180), and/or can be present only around some vias (see e.g., 180, 182) while not being present around other vias (see e.g., 184).

Figure 2:
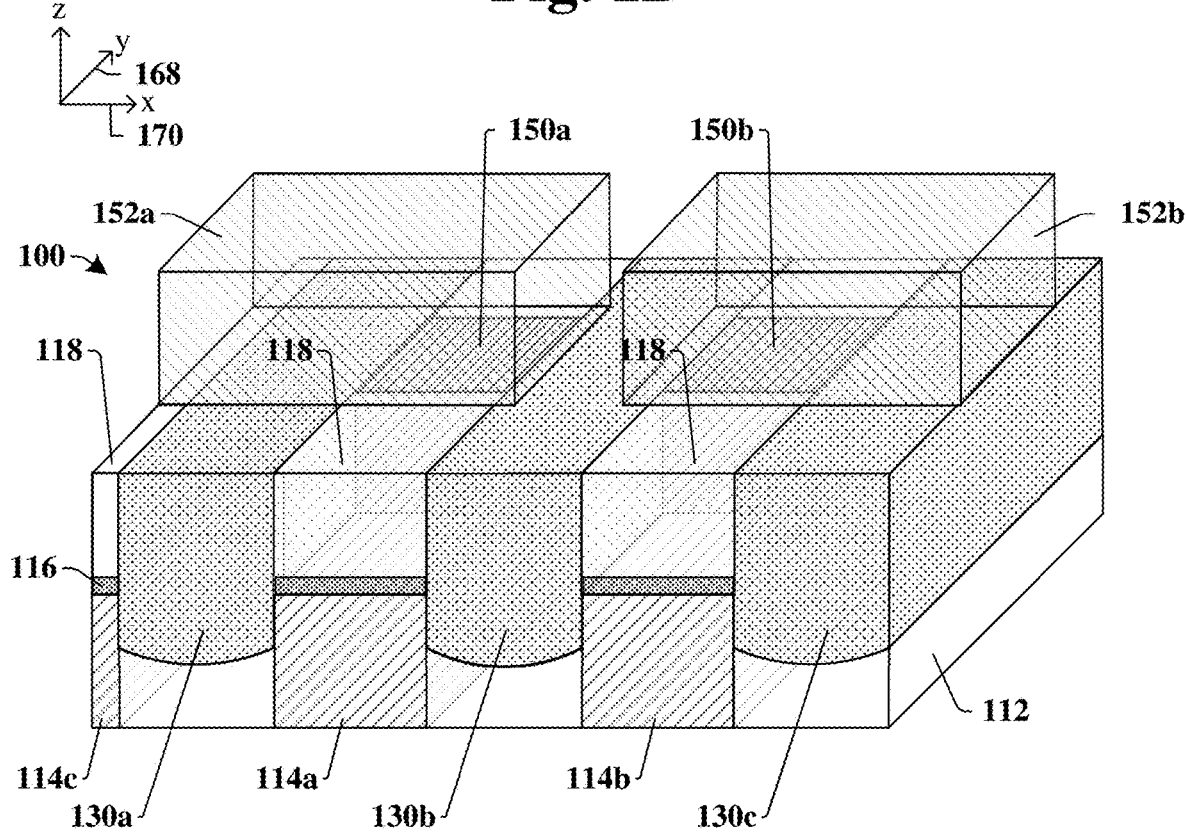
FIG. 2 illustrates a three-dimensional view of some embodiments of a portion of the integrated chip of FIG. 1A.

FIG. 2 illustrates a three-dimensional view of a portion of the self-aligned interconnect structure, as indicated by the dashed rectangle in FIG. 1A. A first lower metal line 114a, a second lower metal line 114b, and a third lower metal line 114c extend through the first ILD layer 112 in the first direction 168. A first upper metal line 152a, a second upper metal line 152b extend in the second direction 170 over the lower metal lines. A first via 150a connects the first lower metal line 114a to the first upper metal line 152a, and a second via 150b connects the second lower metal line 114b to the second upper metal line 152b.

The protective dielectric structure 130 may be disposed on two opposing sides of the vias, such that a sidewall of the first protective dielectric structure 130a neighbors a first outer sidewall of the first via 150a and a sidewall of the second protective dielectric structure 130b neighbors a second outer sidewall of the first via 150a opposite the first outer sidewall. In some embodiments, the protective dielectric structure 130 extends through the second ILD layer 118 and through the second etch stop layer 116 into the first ILD layer 112. The protective dielectric structure 130 may laterally separate the first lower metal line 114a from the second lower metal line 114b at a top of the first lower metal line 114a and a top of the second lower metal line 114b. A lowermost surface of the protective dielectric structure 130 may be disposed below a lowermost surface of the first via 150a and/or second via 150b and below and uppermost surface of the plurality of lower metal lines 114. The protective dielectric structure 130 may electrically isolate the first via 150a from the second lower metal line 114b.

Figure 3:
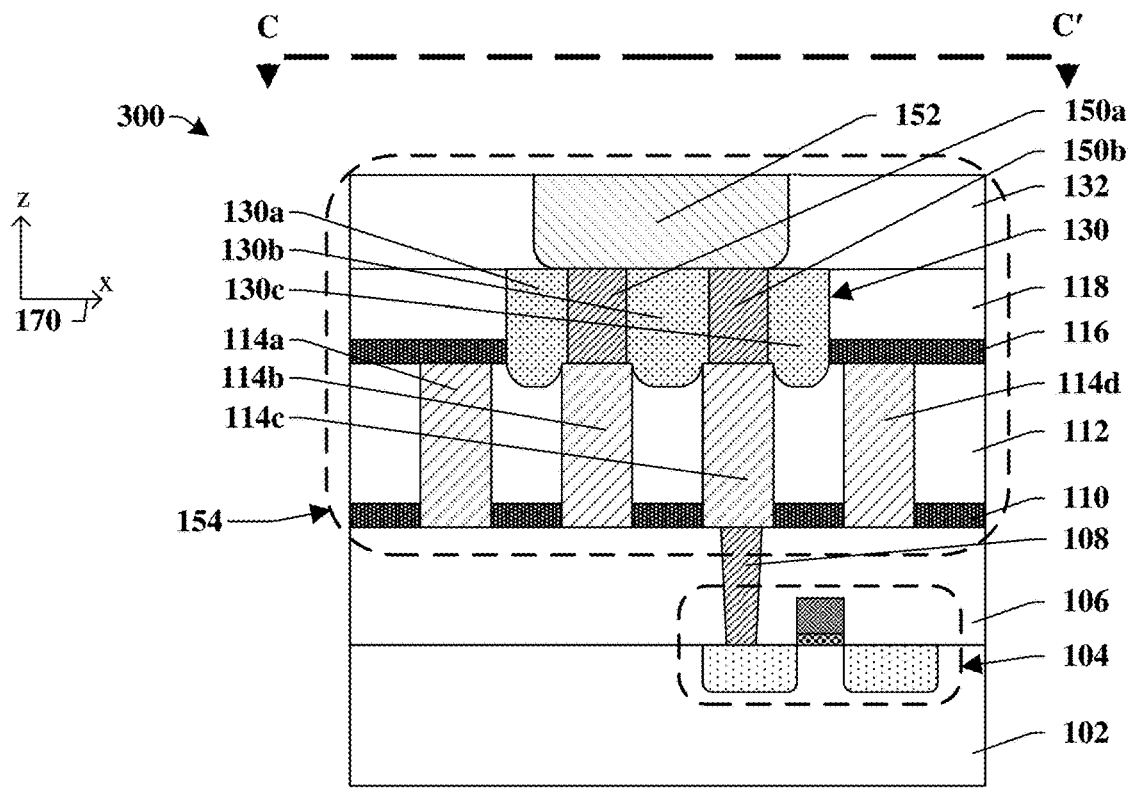
FIG. 3 illustrates a cross-sectional view of some embodiments of an integrated chip comprising a self-aligned interconnect structure.

FIG. 3 illustrates a cross-sectional view of some embodiments of an integrated chip 300 comprising a self-aligned interconnect structure. The cross-sectional view of FIG. 3 may be taken across the line C-C' in FIG. 4. The second protective dielectric structure 130b may comprise a different width than the first protective dielectric structure 130a and the third protective dielectric structure 130c. For example, sidewalls of the second protective dielectric structure 130b that neighbor the first via 150a and the second via 150b may be disposed over the underlying metal lines (e.g., the second lower metal line 114b and the third lower metal line 114c) that underly the first via 150a and the second via 150b. In addition, inner sidewalls of the first protective dielectric structure 130a and the third protective dielectric structure 130c that neighbor the first via 150a and the second via 150b may be disposed over neighboring metal lines (e.g., the second lower metal line 114b and the third lower metal line 114c, respectively) while outer sidewalls of the first protective dielectric structure 130a and the third protective dielectric structure 130c that do not neighbor the first via 150a or the second via 150b may not be disposed over neighboring metal lines of the plurality of lower metal lines (e.g., may not be disposed over the first lower metal line 114a and the fourth lower metal line 114d). Such a configuration results in the first protective dielectric structure 130a, the second protective dielectric structure 130b, and the third protective dielectric structure 130c comprising different widths.

By disposing the protective dielectric structure 130 over the tops of the lower metal lines (e.g., 114b, 114c) that are connected to vias (e.g., 150a, 150b) and isolated from neighboring lower metal lines (e.g., 114a, 114d), a potential for a gap to exist between the protective dielectric structure and the underlying metal line connected to a via is eliminated. As a result, the potential for over-etching into the first ILD layer 112 when forming via openings is decreased. In turn, the potential for unwanted leakage or shorts to occur between electrically isolated vias and metal lines of the plurality of lower metal lines is reduced and thus, the reliability of the integrated chip 300 is increased.

Figure 4:
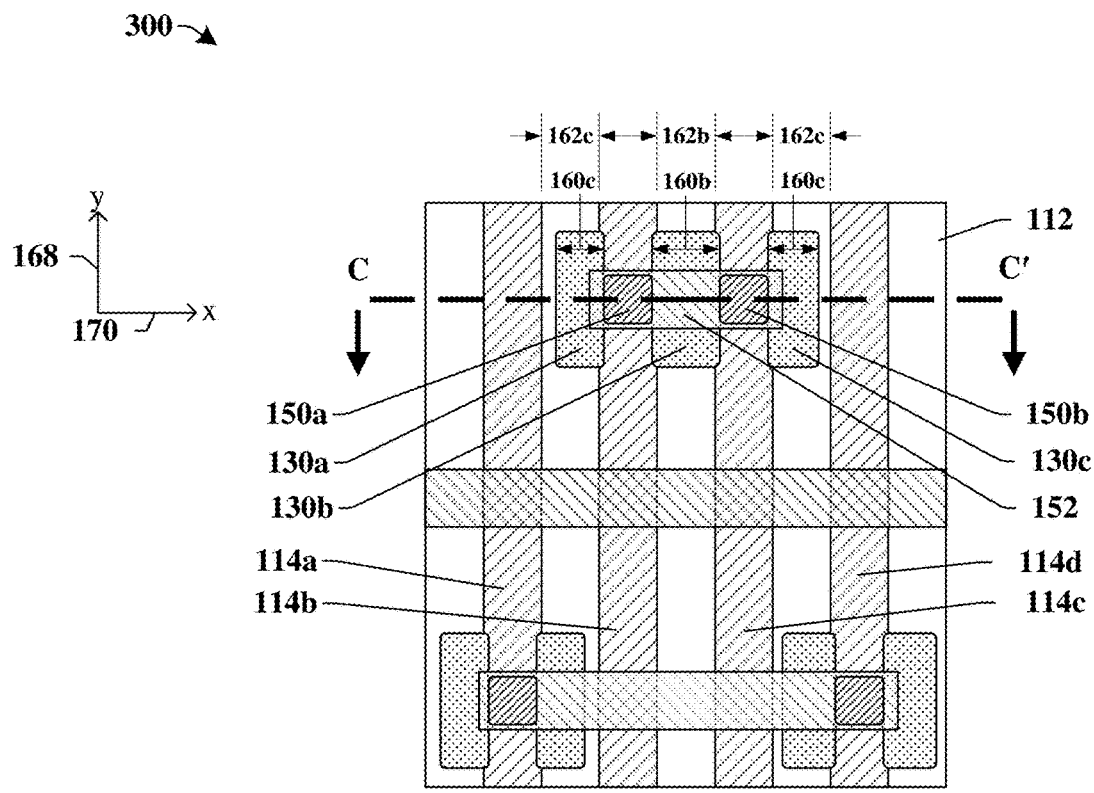
FIG. 4 illustrates a top layout view of some embodiments of the integrated chip of FIG. 3.
Figure 5A:
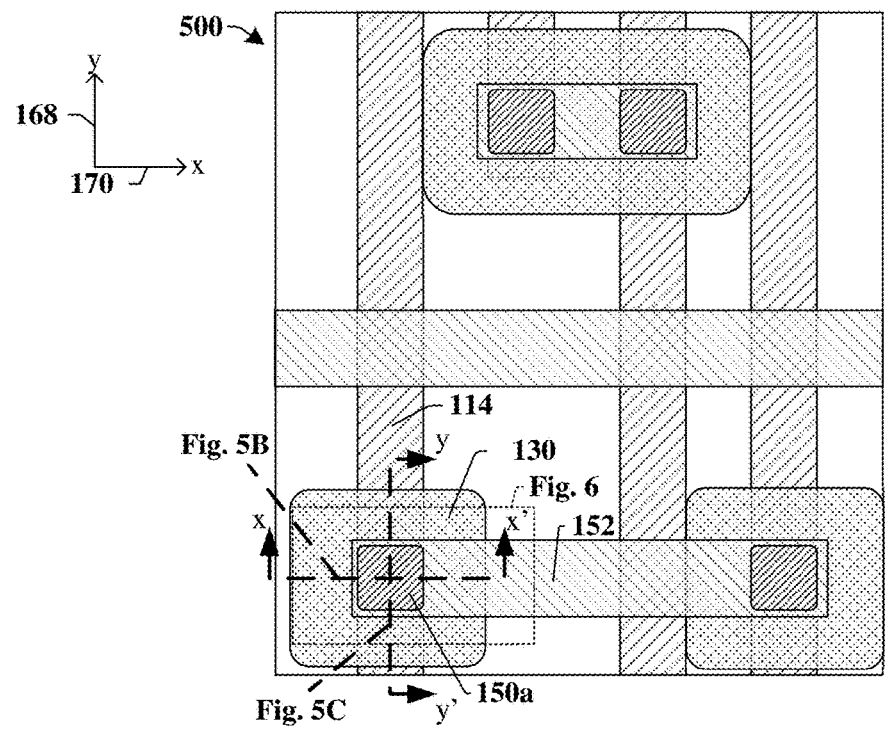
FIG. 5A illustrates a top layout view of some embodiments of an integrated chip comprising a self-aligned interconnect structure.
Figure 5B:
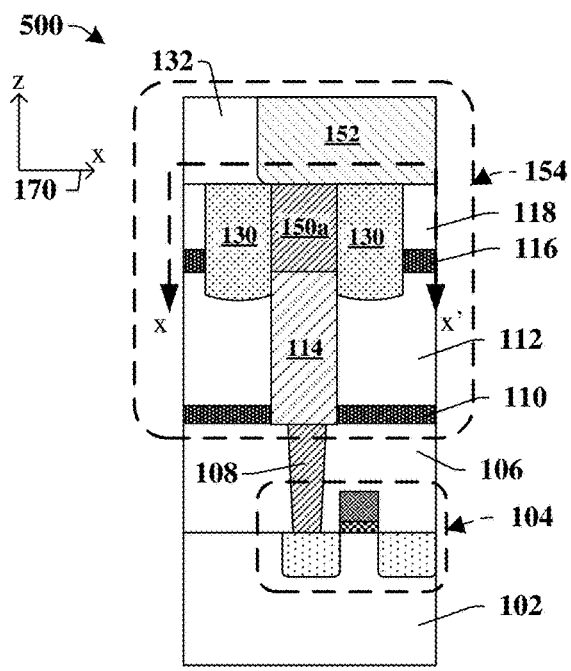
FIG. 5B illustrates a cross-sectional view of some embodiments of the integrated chip of FIG. 5A in a first direction.
Figure 5C:
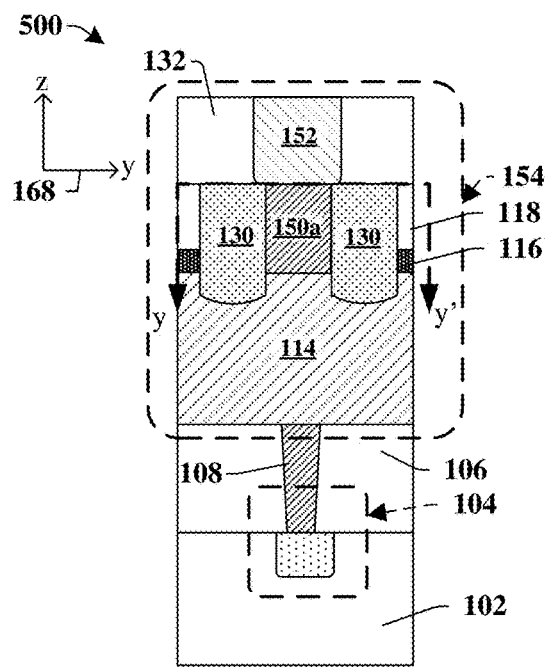
FIG. 5C illustrates a cross-sectional view of some embodiments of the integrated chip of FIG. 5A in a second direction.
Figure 6:
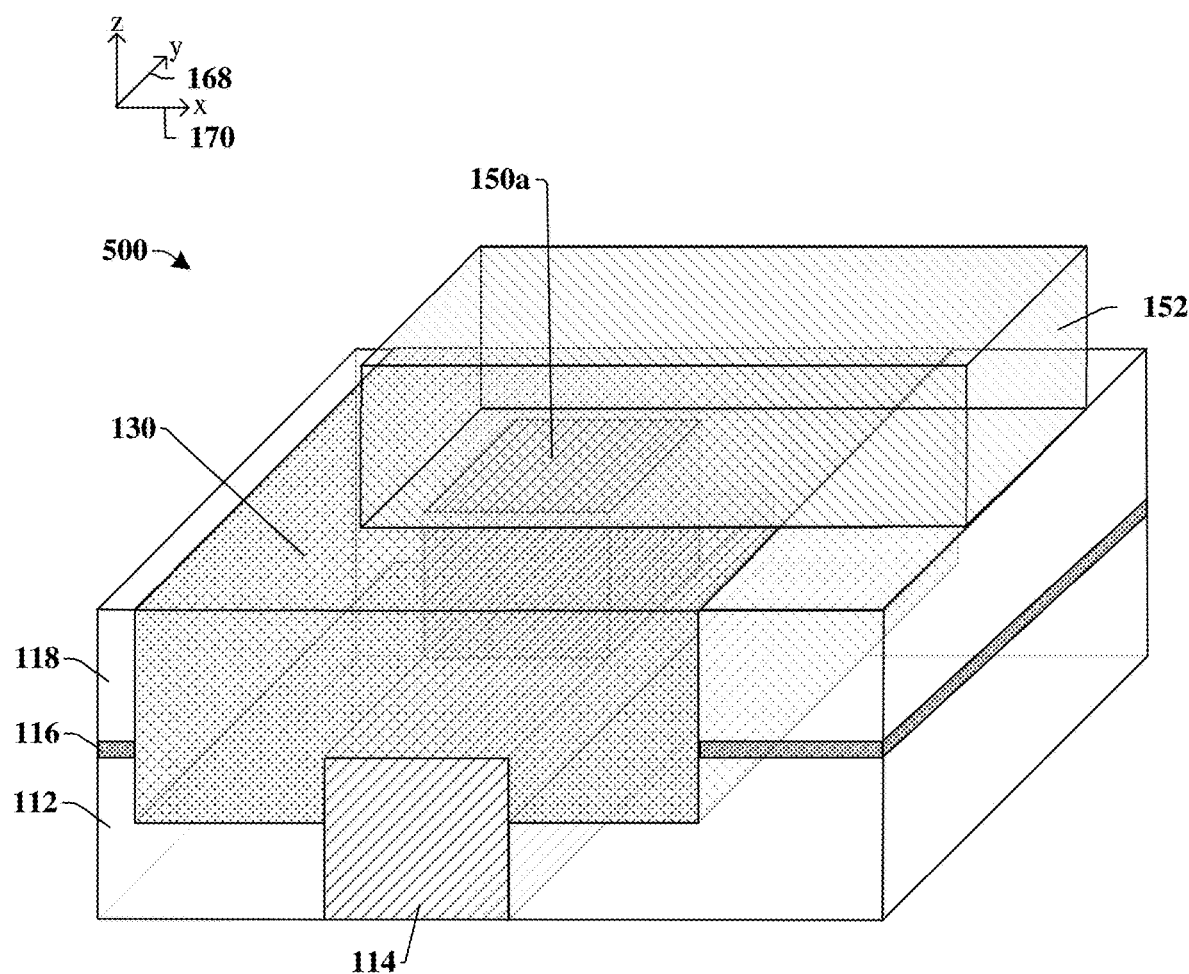
FIG. 6 illustrates a three-dimensional view of some embodiments of a portion of the integrated chip of FIG. 5A.

FIG. 4 illustrates a top layout view of some embodiments of the integrated chip 300 of FIG. 3. The second protective dielectric structure 130b neighbors the first via 150a and the second via 150b on both sides while the first protective dielectric structure 130a and the third protective dielectric structure 130c only neighbor the vias (e.g., 150a, 150b) on one side. Sidewalls of the first protective dielectric structure 130a, the second protective dielectric structure 130b, and the third protective dielectric structure 130c that neighbor the first via 150a or the second via 150b (e.g., inner sidewall of the first protective dielectric structure 130a, inner sidewall of the third protective dielectric structure 130c, and sidewalls of the second protective dielectric structure 130b) are formed over a top of the underlying lower metal lines (e.g., 114b, 114c). Sidewalls of the first protective dielectric structure 130a, the second protective dielectric structure 130b, and the third protective dielectric structure 130c that do not neighbor the first via 150a or the second via 150b (e.g., outer sidewalls of the first protective dielectric structure 130a and the third protective dielectric structure 130c) are formed over a top of the first ILD layer 112 and spaced apart from neighboring lower metal lines (e.g., 114a, 114d). As a result, a first width 160b of the inner portion of the protective dielectric structure 130 (e.g., 130b) is greater than a second width 160c of the outer portions of the protective dielectric structure 130 (e.g., 130a, 130c). The first width 160b is greater than a width 162b between the second lower metal line 114b and the third lower metal line 114c, but the second width 160c is not greater than a width 162c between the first lower metal line 114a and the second lower metal line 114b nor is it greater than a width 162c between the third lower metal line 114c and the fourth lower metal line 114d.

FIGS. 5A-5C and FIG. 6 illustrate another embodiment of an integrated chip 500 comprising a protective dielectric structure 130 that includes a "ring" layout when viewed from above that helps limit via misalignment. Thus, rather than the protective dielectric structure 130 manifesting as "stripes" as depicted in FIGS. 1A-1D, in FIGS. 5A-5C and FIG. 6, the protective dielectric structure 130 is a "ring" of dielectric material that laterally surrounds the via 150 on all sides. Thus, the protective dielectric structure 130 may be disposed along a first set of opposing sidewalls of the first via 150a that extend in parallel with the first axis 168 and along a second set of opposing sidewalls of the first via 150a that extend in parallel with the second axis 170 (i.e., perpendicular to the first axis 168).

FIGS. 7A-24 illustrate cross-sectional views 700-2400 of some embodiments of a method of forming an integrated chip comprising a self-aligned interconnect structure 154. Although FIGS. 7A-24 are described in relation to a method, it will be appreciated that the structures disclosed in FIGS. 7A-24 are not limited to such a method, but instead may stand alone as structures independent of the method.

Figure 7A:
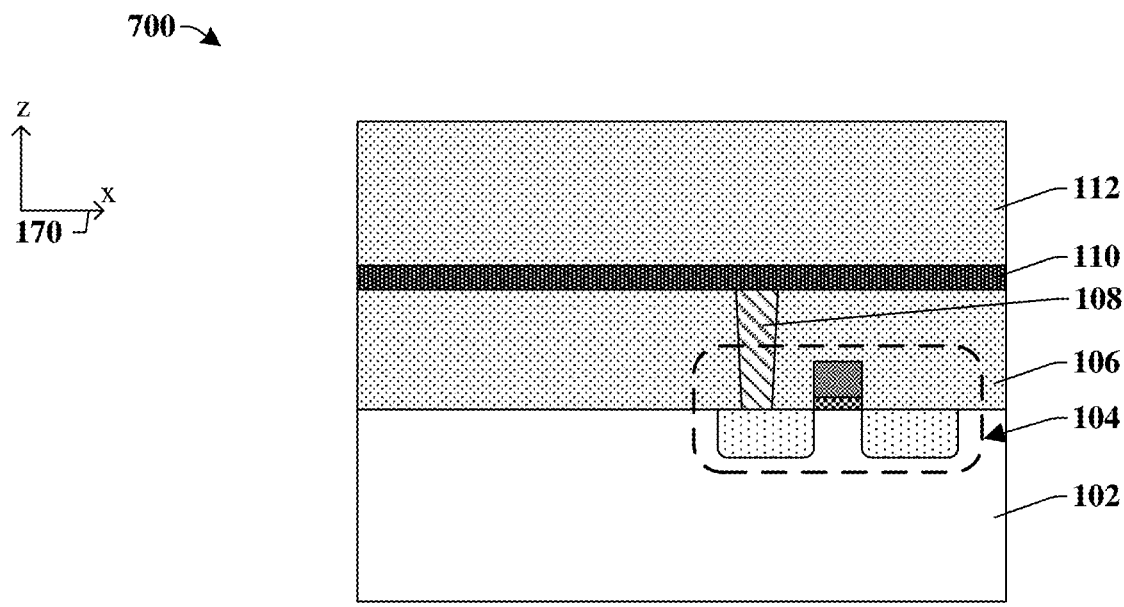
FIGS. 7A-24 illustrate a series of cross-sectional views of some embodiments of a method for forming an integrated chip comprising a self-aligned interconnect structure.

As shown in cross-sectional view 700 of FIG. 7A, a first etch stop layer 110 is formed over a semiconductor substrate 102. A first ILD layer 112 is formed over the first etch stop layer 110. The first etch stop layer 110 and the first ILD layer 112 may each be formed by physical vapor deposition (PVD), chemical vapor deposition (CVD), atomic layer deposition (ALD), or a spin on process and may be formed at a temperature of about 150 to 500 degrees Celsius.

Figure 7B:
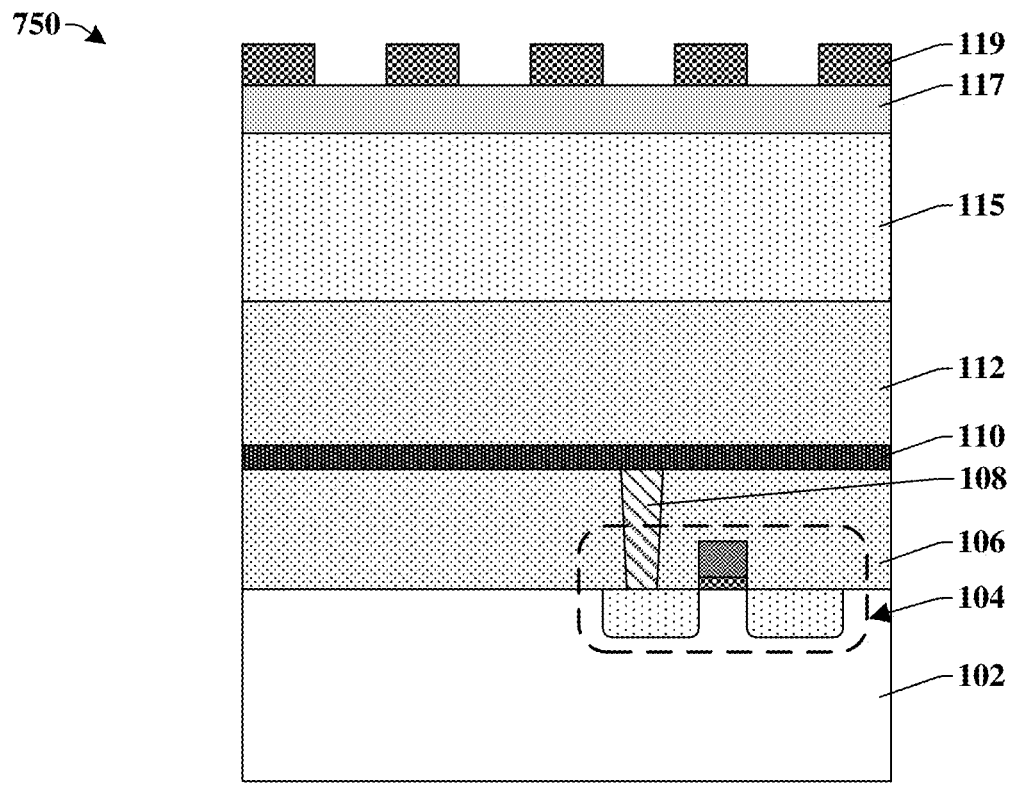

As shown in cross-sectional view 750 of FIG. 7B, a first anti-reflective coating (ARC) layer 115 is formed over the first ILD layer 112, a second ARC layer 117 is formed over the first ARC layer 115, and a first photoresist mask 119 is formed over the second ARC layer 117. The first ARC layer 115, the second ARC layer 117, and the first photoresist mask 119 may be formed by CVD or a spin on process. The first ARC layer 115 may comprise a different material than the second ARC layer 117. Any of the first ARC layer 115 and the second ARC layer 117 may comprise silicon oxide, silicon nitride, silicon carbide, silicon oxynitride, aluminum oxide, titanium oxide, tantalum oxide, magnesium fluoride, lanthanum fluoride, aluminum fluoride, some other anti-reflective material, or any combination of the foregoing. The first photoresist mask 119 may be patterned by a photolithographic process. In some embodiments, a different number of ARC layers may be used.

Figure 8A:
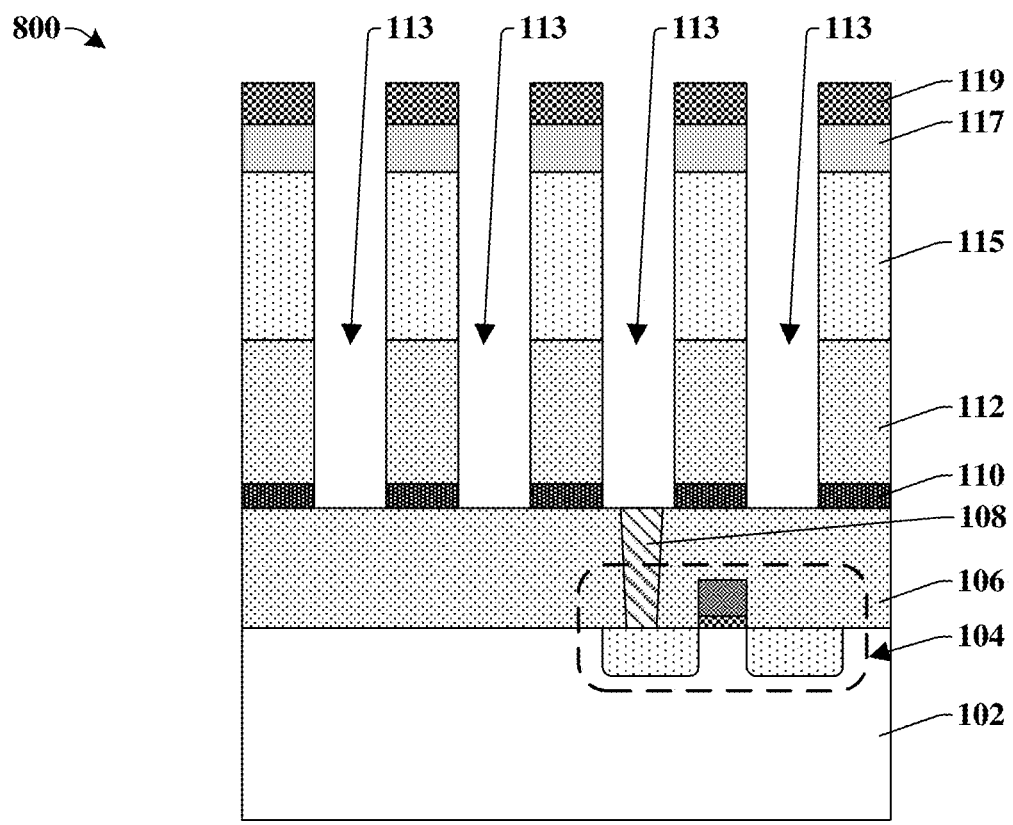

As shown in cross-sectional view 800 of FIG. 8A, the first ARC layer 115 and the second ARC layer 117 are etched with the first photoresist mask 119 in place. The first ILD layer 112 and the first etch stop layer 110 are also etched to form a plurality of first trenches 113 in the first ILD layer 112 that are laterally spaced apart from each other by the first ILD layer 112.

The etches illustrated in FIG. 8A may comprise inductively coupled plasma (ICP) etching, capacitively couple plasma (CCP) etching, or remote plasma etching and may utilize methane, fluoromethane, difluoromethane, fluoroform, octafluorocyclobutane, hexafluoro-1,3-butadiene, tetrafluoromethane, hydrogen, hydrogen bromide, carbon monoxide, carbon dioxide, oxygen, Boron trichloride, chlorine, nitrogen, helium, neon, argon, any other suitable etchant, or any combination of the foregoing. The etches may alternatively or additionally comprise a wet etching process that may utilize hydrofluoric acid, nitric acid, acetic acid, hydrochloric acid, phosphoric acid, citric acid, or any combination of the foregoing. The etches may be performed in an atmosphere with a pressure of 0.2 to 120 millitorrs and a temperature of 0 to 100 degrees Celsius. A power utilized during the etches may be about 50 to 3000 watts and a bias voltage applied during the etches may be about 0 to 1200 volts.

Figure 8B:
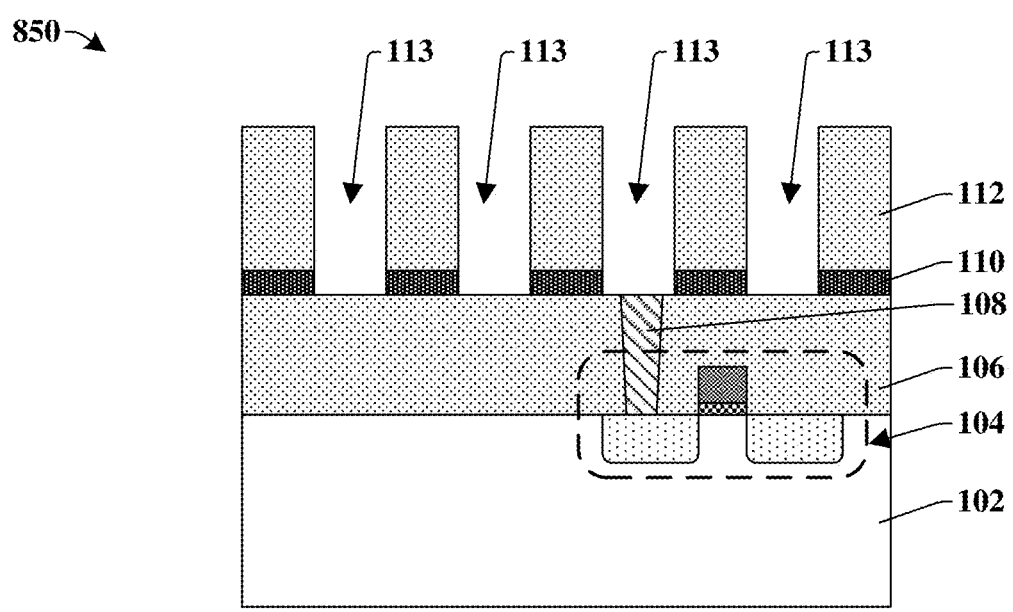

As shown in cross-sectional view 850 of FIG. 8B, the first ARC layer 115, the second ARC layer 117, and the first photoresist mask 119 are removed. The removal may comprise one or more etches such as, for example, an ICP etching, CCP etching, remote plasma etching, isotropic chemical etching, or a wet etching process that may utilize hydrofluoric acid, nitric acid, acetic acid, hydrochloric acid, phosphoric acid, citric acid, or any combination of the foregoing.

Figure 9A:
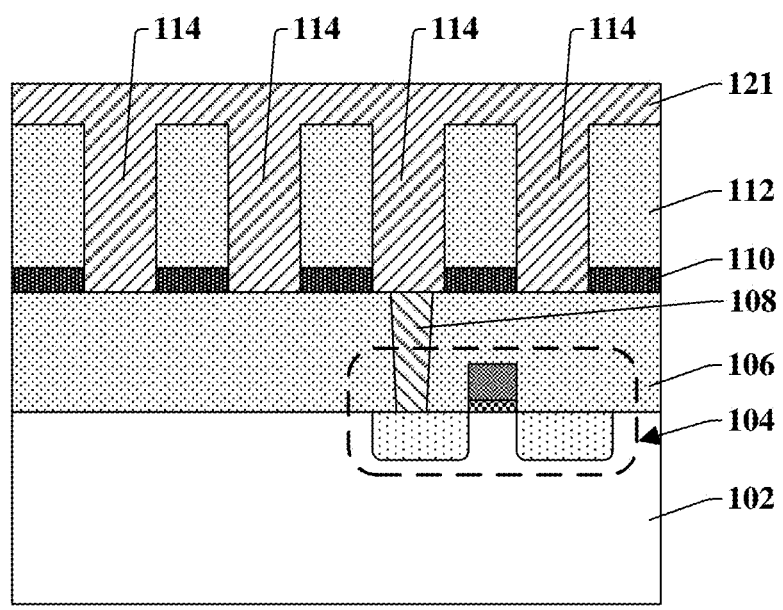

As shown in cross-sectional view 900 of FIG. 9A, a first metal 121 is deposited in the plurality of first trenches 113 to form a plurality of lower metal lines 114 in the plurality of first trenches 113 and along sidewalls of the first ILD layer 112. Metal lines of the plurality of lower metal lines 114 are laterally spaced apart from one another by the first ILD layer 112. The first metal 121 may be deposited by sputtering, electroplating, or another suitable metal deposition technique and, deposition may occur at a temperature of about 150 to 500 degrees Celsius.

Figure 9B:
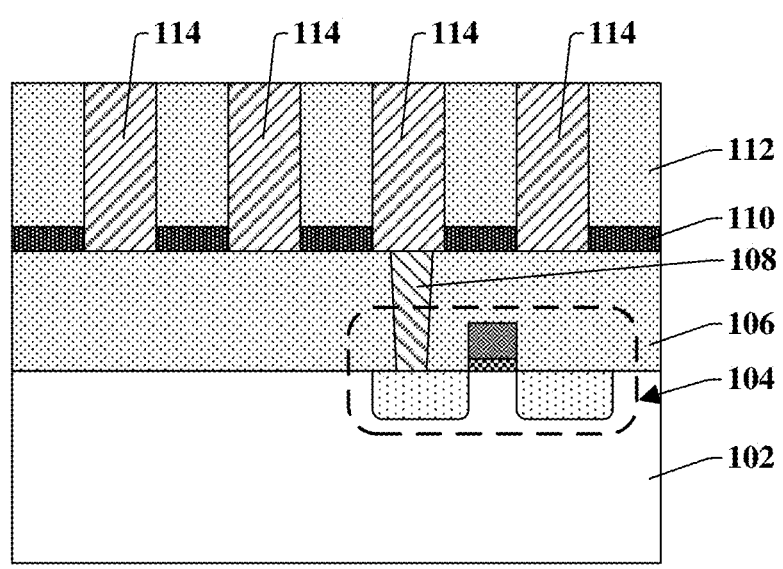

As shown in cross-sectional view 950 of FIG. 9B, a chemical mechanical polish (CMP) is performed on the first metal 121 to remove the first metal 121 from a top of the first ILD layer 112.

Figure 10:
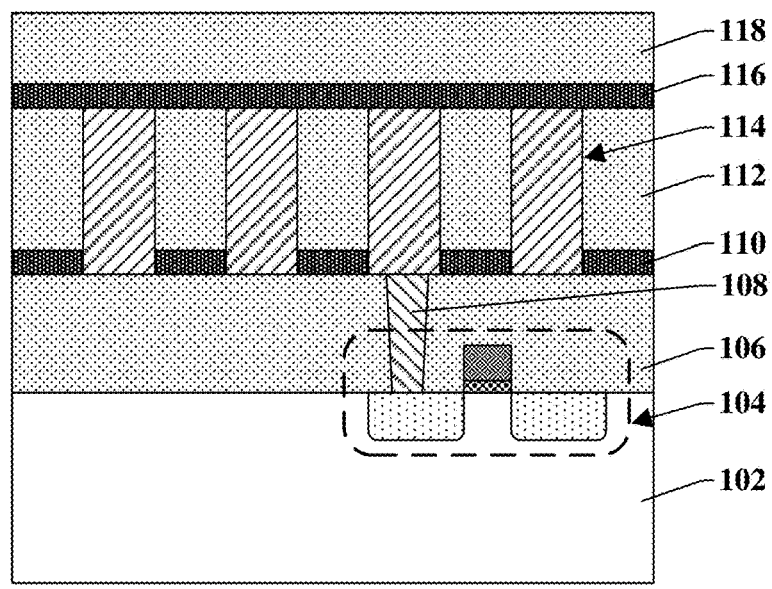

As shown in cross-sectional view 1000 of FIG. 10, a second etch stop layer 116 is formed over the first ILD layer 112. A second ILD layer 118 is formed over the second etch stop layer 116. The second etch stop layer 116 and the second ILD layer 118 may be formed by PVD, CVD, ALD, or a spin on process and may be formed at a temperature of about 150 to 500 degrees Celsius.

Figure 11:
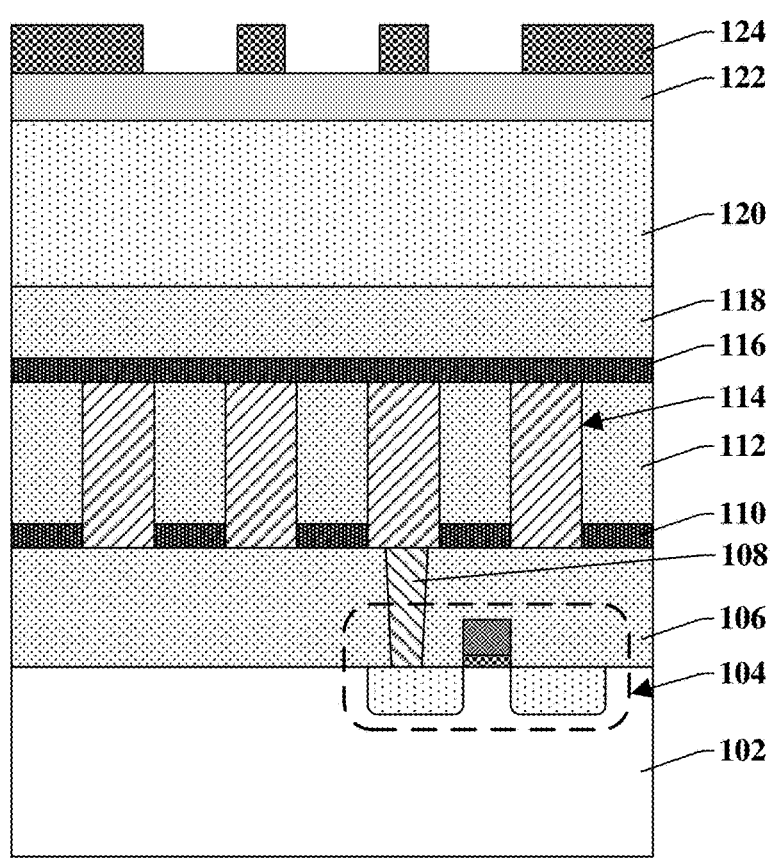

As shown in cross-sectional view 1100 of FIG. 11, a third ARC layer 120 is formed over the second ILD layer 118. A fourth ARC layer 122 is formed over the third ARC layer 120. In addition, a second photoresist mask 124 is formed over the fourth ARC layer 122. The third ARC layer 120, the fourth ARC layer 122, and the second photoresist mask 124 may be formed by CVD or a spin on process. The second photoresist mask 124 may comprise openings aligned over portions of the first ILD layer 112 that are disposed between metal lines of the plurality of lower metal lines 114. The second photoresist mask 124 may be patterned by a photolithographic process. The third ARC layer 120 may comprise a different material than the fourth ARC layer 122. Any of the third ARC layer 120 and the fourth ARC layer 122 may comprise silicon oxide, silicon nitride, silicon carbide, silicon oxynitride, aluminum oxide, titanium oxide, tantalum oxide, magnesium fluoride, lanthanum fluoride, aluminum fluoride, some other anti-reflective material, or any combination of the foregoing. In some embodiments, a different number of ARC layers may be used.

Figure 12:
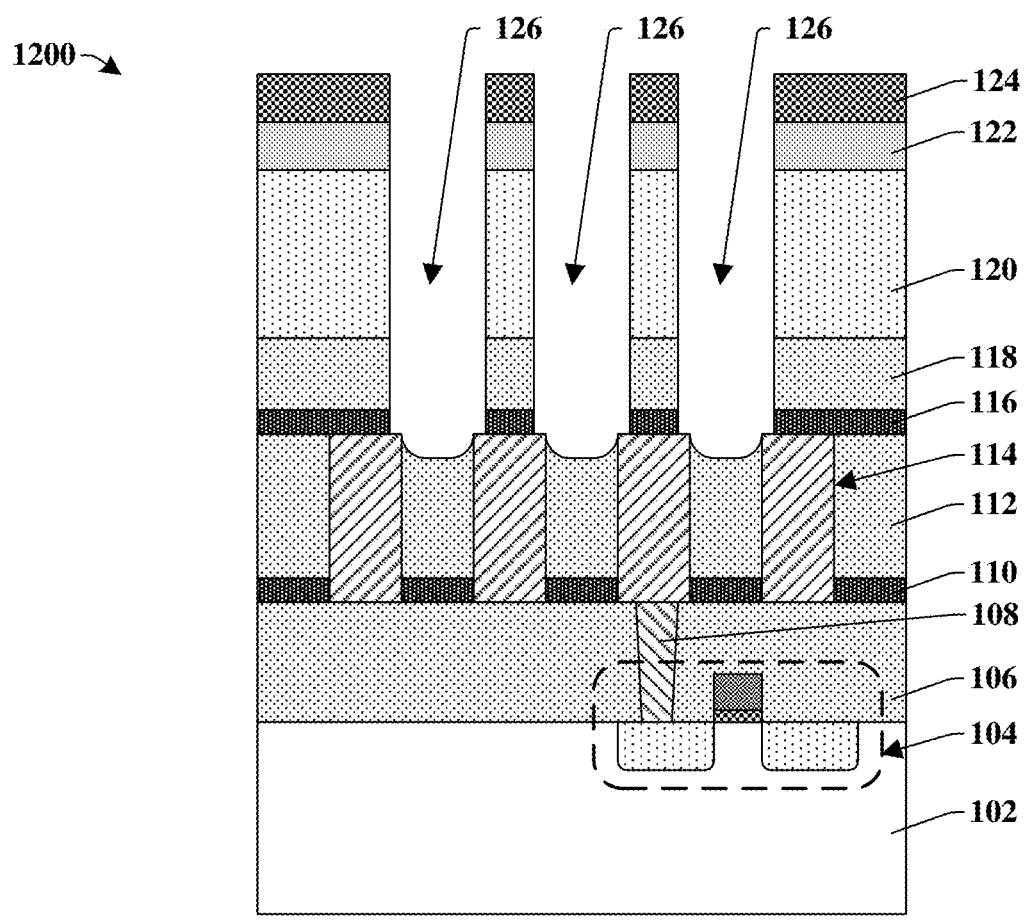

As shown in cross-sectional view 1200 of FIG. 12, the third ARC layer 120 and the fourth ARC layer 122 are etched with the second photoresist mask 124 in place. The second ILD layer 118, the second etch stop layer 116, and the first ILD layer 112 are also etched to form a plurality of first openings 126 (i.e., a plurality of first recesses) in the second ILD layer 118, over and in the first ILD layer 112, and between metal lines of the plurality of lower metal lines 114. Openings of the plurality of first openings 126 may extend from over one metal line of the plurality of lower metal lines 114 to over a neighboring metal line of the plurality of lower metal lines 114.

The etches illustrated in FIG. 12 may comprise ICP etching, CCP etching, or remote plasma etching and may utilize methane, fluoromethane, difluoromethane, fluoroform, octafluorocyclobutane, hexafluoro-1,3-butadiene, tetrafluoromethane, hydrogen, hydrogen bromide, carbon monoxide, carbon dioxide, oxygen, Boron trichloride, chlorine, nitrogen, helium, neon, argon, any other suitable etchant, or any combination of the foregoing. The etches may alternatively or additionally comprise a wet etching process that may utilize hydrofluoric acid, nitric acid, acetic acid, hydrochloric acid, phosphoric acid, citric acid, or any combination of the foregoing. The etches may be performed in an atmosphere with a pressure of 0.2 to 120 millitorrs and a temperature of 0 to 100 degrees Celsius. A power utilized during the etches may be about 50 to 3000 watts and a bias voltage applied during the etches may be about 0 to 1200 volts.

Figure 13:
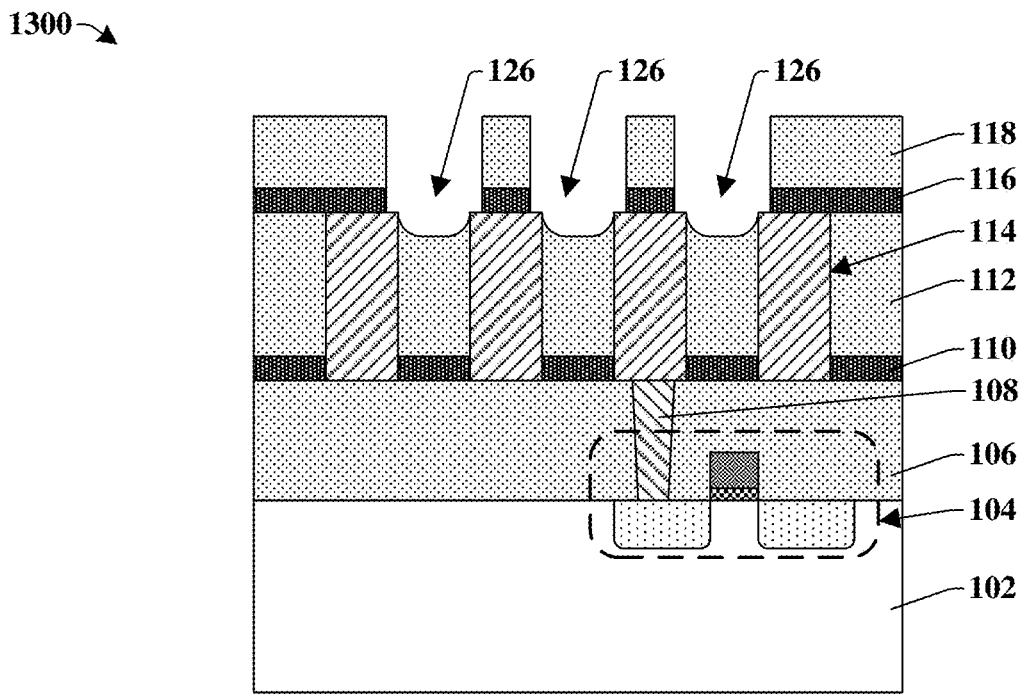

As shown in cross-sectional view 1300 of FIG. 13, the third ARC layer 120, the fourth ARC layer 122, and the second photoresist mask 124 are removed. The removal may comprise one or more etches such as, for example, an ICP etching, CCP etching, remote plasma etching, isotropic chemical etching, or a wet etching process that may utilize hydrofluoric acid, nitric acid, acetic acid, hydrochloric acid, phosphoric acid, citric acid, or any combination of the foregoing.

Figure 14:
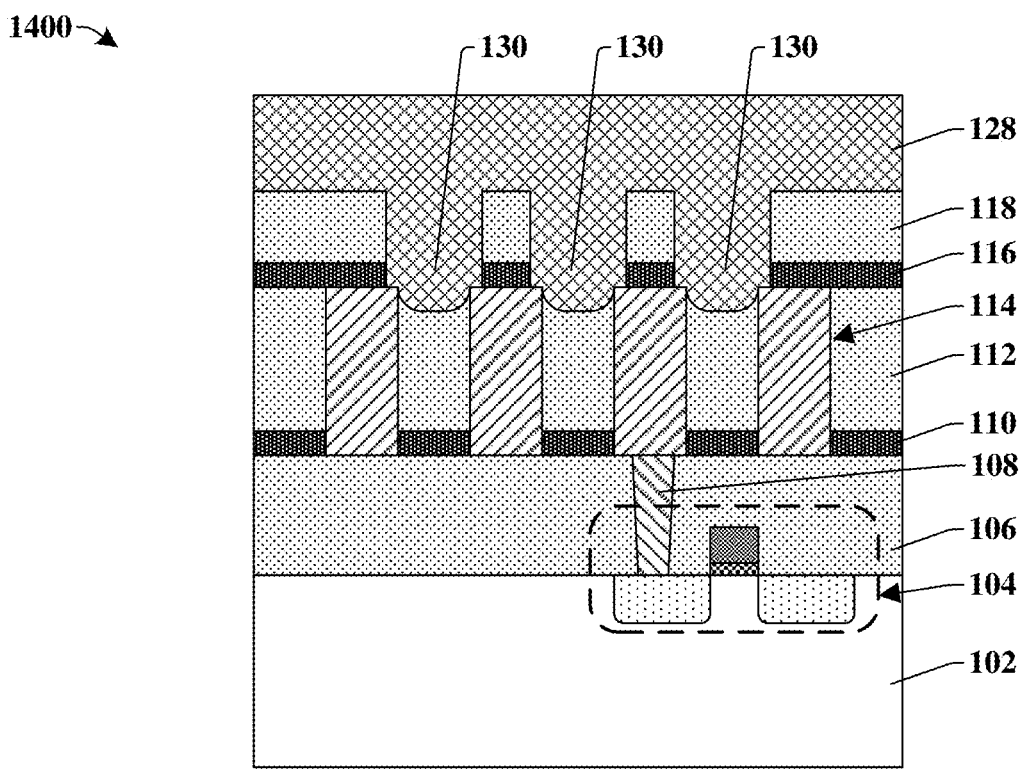

As shown in cross-sectional view 1400 of FIG. 14, a protective dielectric material 128 is deposited over the second ILD layer 118 and in the plurality of first openings 126 to form a protective dielectric structure 130 in the plurality of first openings 126. The protective dielectric material 128 may be formed by PVD, CVD, ALD, or a spin on process and may be formed at a temperature of 150 to 400 degrees Celsius.

Figure 15:
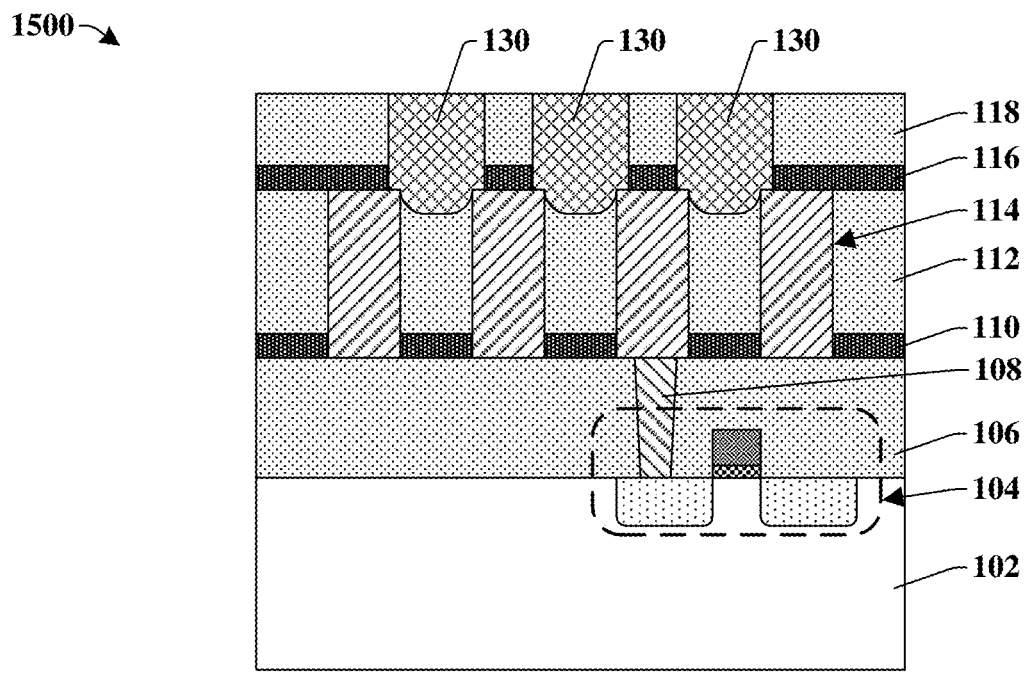

As shown in cross-sectional view 1500 of FIG. 15, a CMP is performed on the protective dielectric material 128 to remove the protective dielectric material from a top of the second ILD layer 118. As a result, the protective dielectric structure 130 that is disposed in the plurality of first openings 126 comprises top surfaces even with the top of the second ILD layer 118.

Figure 16:
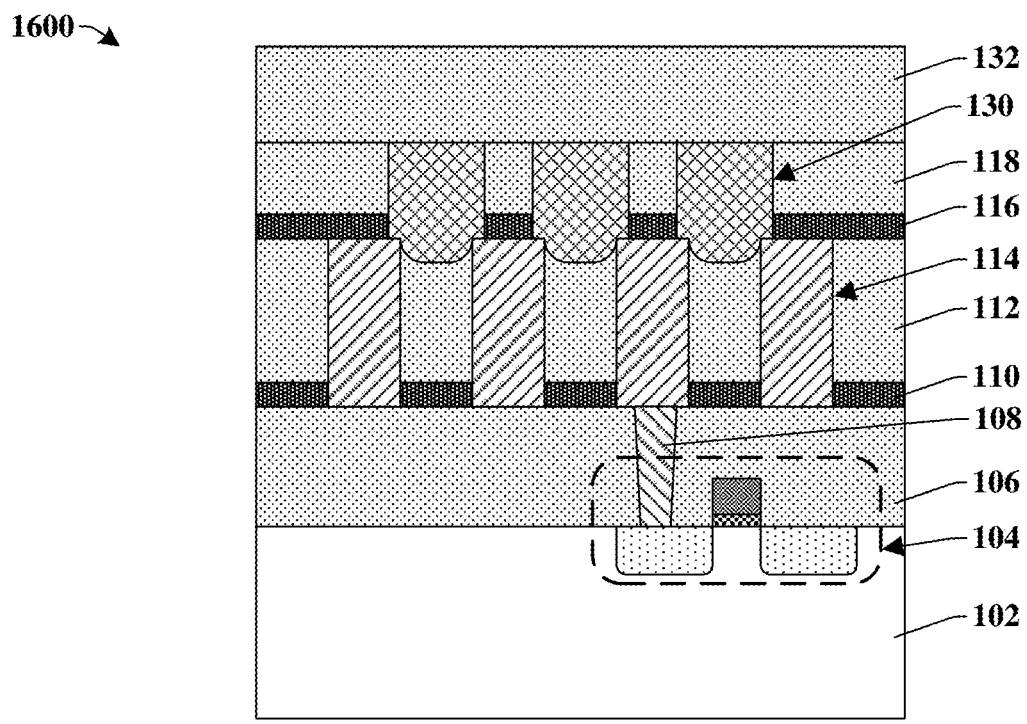

As shown in cross-sectional view 1600 of FIG. 16, a third ILD layer 132 is formed over the second ILD layer 118 and over the protective dielectric structure 130. The third ILD layer 132 may be formed by PVD, CVD, ALD, or a spin on process and may be formed at a temperature of 150 to 400 degrees Celsius.

Figure 17:
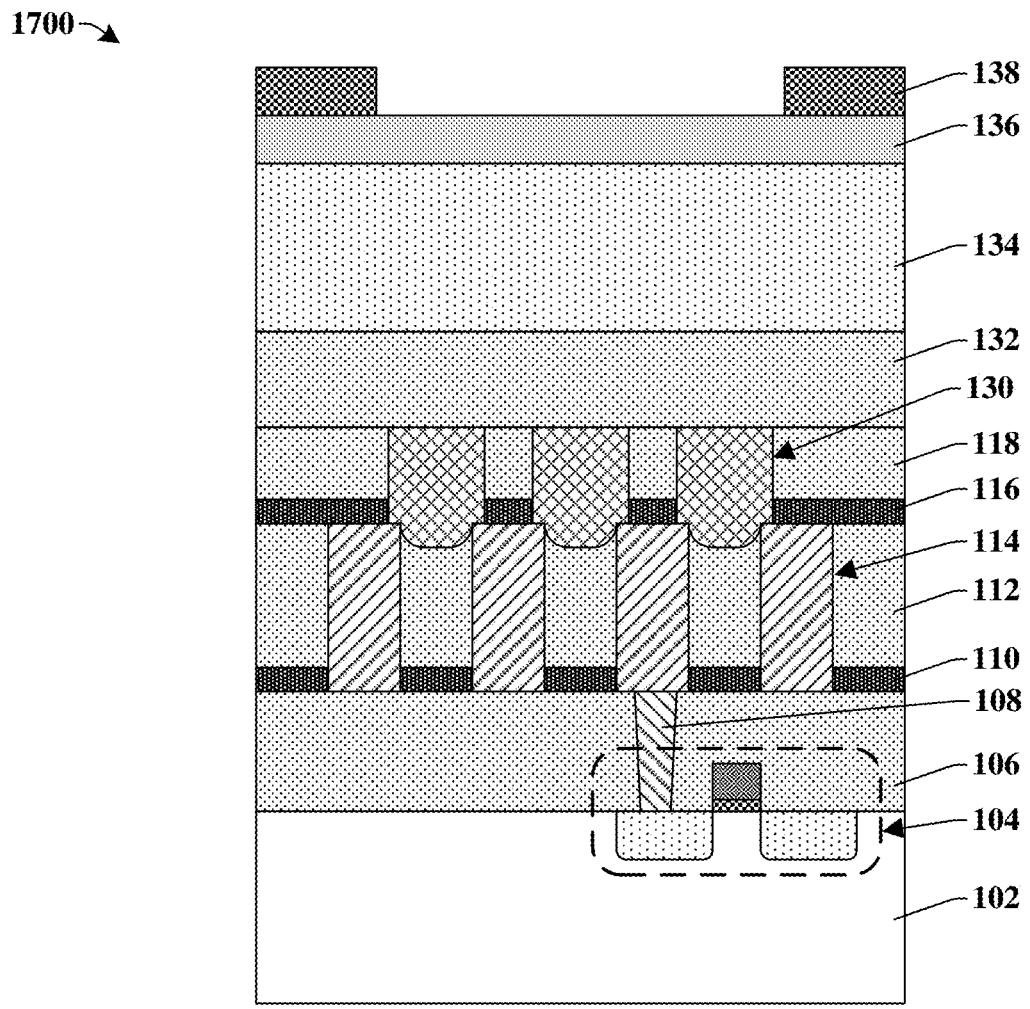

As shown in cross-sectional view 1700 of FIG. 17, a fifth ARC layer 134 is formed over the third ILD layer 132. A sixth ARC layer 136 is formed over the fifth ARC layer 134. In addition, a third photoresist mask 138 is formed over the sixth ARC layer 136. The fifth ARC layer 134, the sixth ARC layer 136, and the third photoresist mask 138 may be formed by CVD or a spin on process. The third photoresist mask 138 may comprise an opening aligned over the protective dielectric structure 130. The third photoresist mask 138 may be patterned by a photolithographic process. The fifth ARC layer 134 may comprise a different material than the sixth ARC layer 136. Any of the fifth ARC layer 134 and the sixth ARC layer 136 may comprise silicon oxide, silicon nitride, silicon carbide, silicon oxynitride, aluminum oxide, titanium oxide, tantalum oxide, magnesium fluoride, lanthanum fluoride, aluminum fluoride, some other anti-reflective material, or any combination of the foregoing. In some embodiments, a different number of ARC layers may be used.

Figure 18:
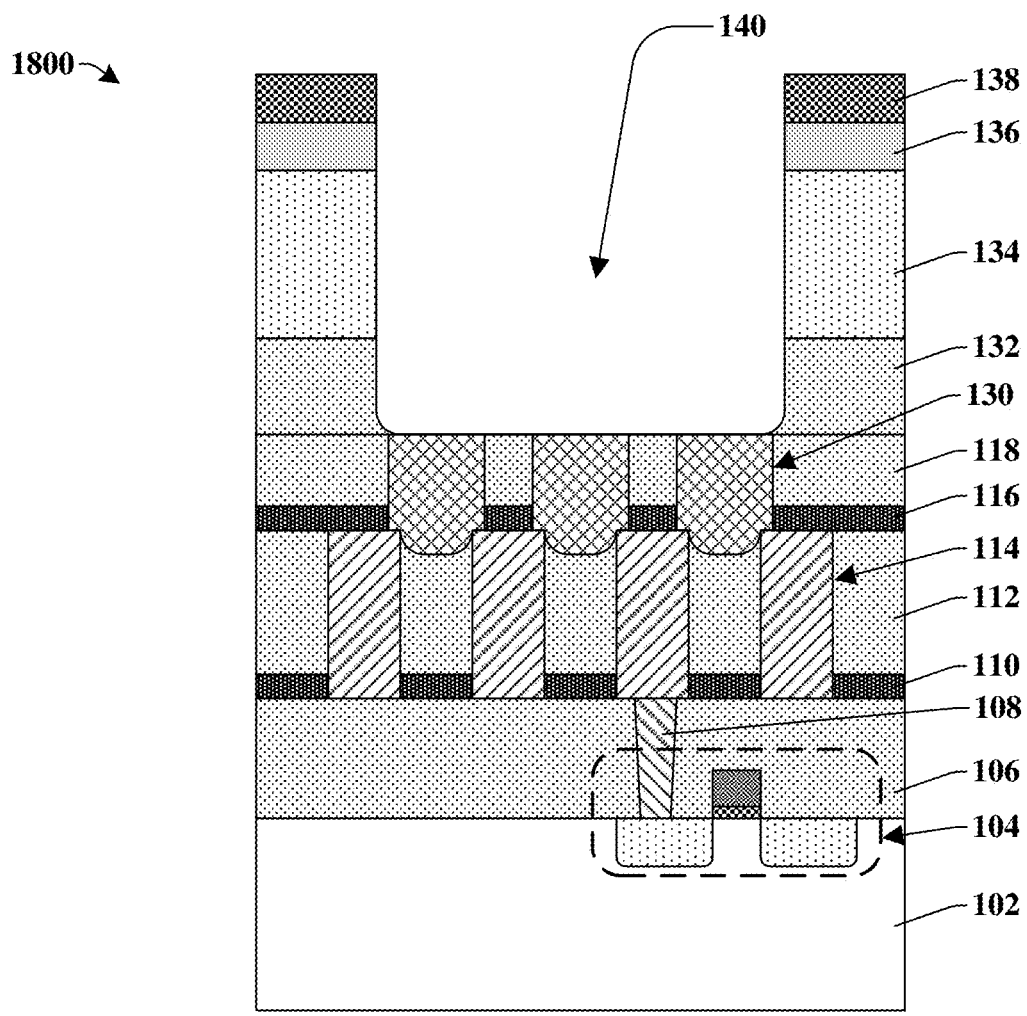

As shown in cross-sectional view 1800 of FIG. 18, the fifth ARC layer 134 and the sixth ARC layer 136 are etched with the third photoresist mask 138 in place. The third ILD layer 132, is also etched to form a second trench 140 in the third ILD layer 132 and over the protective dielectric structure 130. The second trench 140 may have a width of about 5 to 3000 nanometers. Sidewalls of the second trench 140 may be angled at 50 to 95 degrees, as measured from horizontal.

The etches illustrated in FIG. 18 may comprise reactive ion etching such as, for example, ICP etching or CCP etching and may utilize methane, fluoromethane, difluoromethane, fluoroform, octafluorocyclobutane, hexafluoro-1,3-butadiene, tetrafluoromethane, hydrogen, hydrogen bromide, carbon monoxide, carbon dioxide, oxygen, Boron trichloride, chlorine, nitrogen, helium, neon, argon, any other suitable etchant, or any combination of the foregoing. The etches may alternatively or additionally comprise a wet etching process that may utilize hydrofluoric acid, nitric acid, acetic acid, hydrochloric acid, phosphoric acid, citric acid, or any combination of the foregoing. The etches may be performed in an atmosphere with a pressure of 0.2 to 120 millitorrs and a temperature of 0 to 100 degrees Celsius. A power utilized during the etches may be about 50 to 3000 watts and a bias voltage applied during the etches may be about 0 to 1200 volts.

Figure 19:
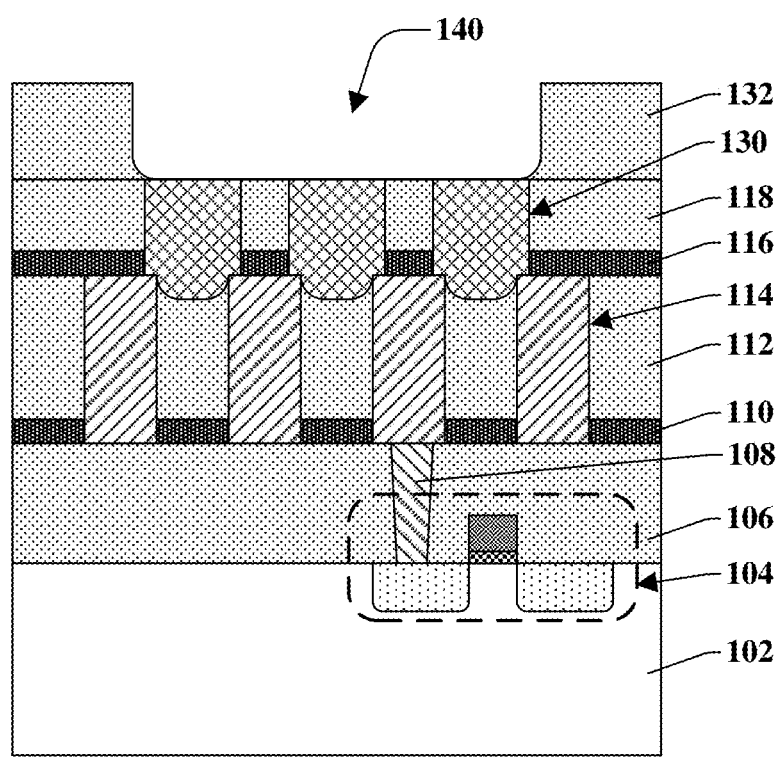

As shown in cross-sectional view 1900 of FIG. 19, the fifth ARC layer 134, the sixth ARC layer 136, and the third photoresist mask 138 are removed. The removal may comprise one or more etches such as, for example, an ICP etching, CCP etching, remote plasma etching, isotropic chemical etching, or a wet etching process that may utilize hydrofluoric acid, nitric acid, acetic acid, hydrochloric acid, phosphoric acid, citric acid, or any combination of the foregoing.

Figure 20:
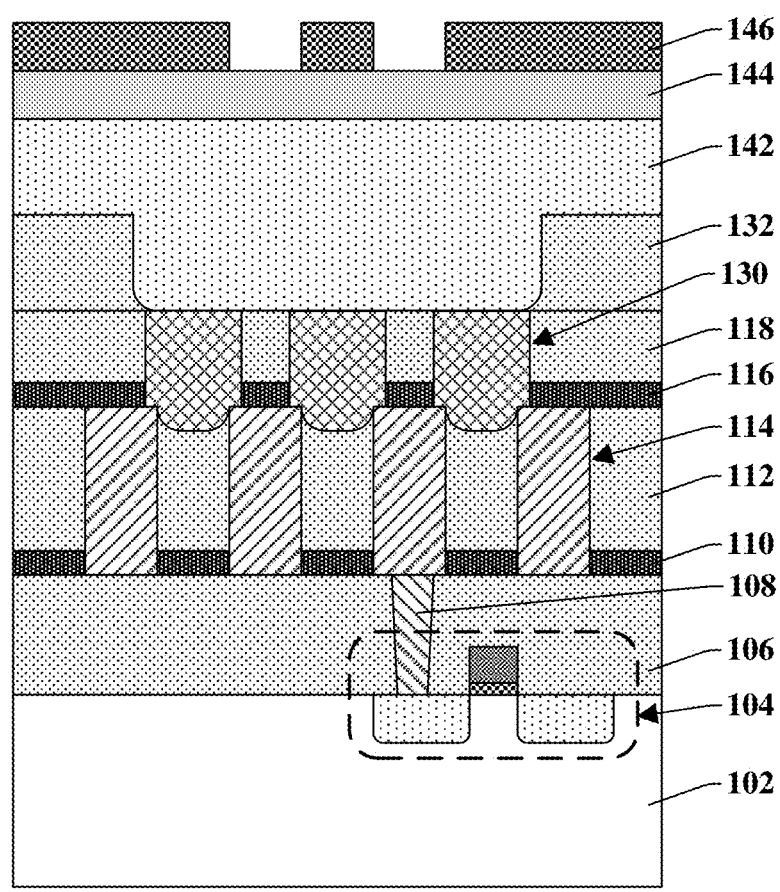

As shown in cross-sectional view 2000 of FIG. 20, a seventh ARC layer 142 and an eighth ARC layer 144 are formed over the third ILD layer 132, in the second trench 140, and over the protective dielectric structure 130. In addition, a fourth photoresist mask 146 is formed over the eighth ARC layer 144. The seventh ARC layer 142, the eighth ARC layer 144, and the fourth photoresist mask 146 may be formed by CVD or a spin on process. The fourth photoresist mask 146 may comprise openings aligned over portions of the second ILD layer 118 that are disposed between portions of the protective dielectric structure 130. The fourth photoresist mask 146 may be patterned by a photolithographic process. The seventh ARC layer 142 may comprise a different material than the eighth ARC layer 144. Any of the seventh ARC layer 142 and the eighth ARC layer 144 may comprise silicon oxide, silicon nitride, silicon carbide, silicon oxynitride, aluminum oxide, titanium oxide, tantalum oxide, magnesium fluoride, lanthanum fluoride, aluminum fluoride, some other anti-reflective material, or any combination of the foregoing. In some embodiments, a different number of ARC layers may be used.

Figure 21:
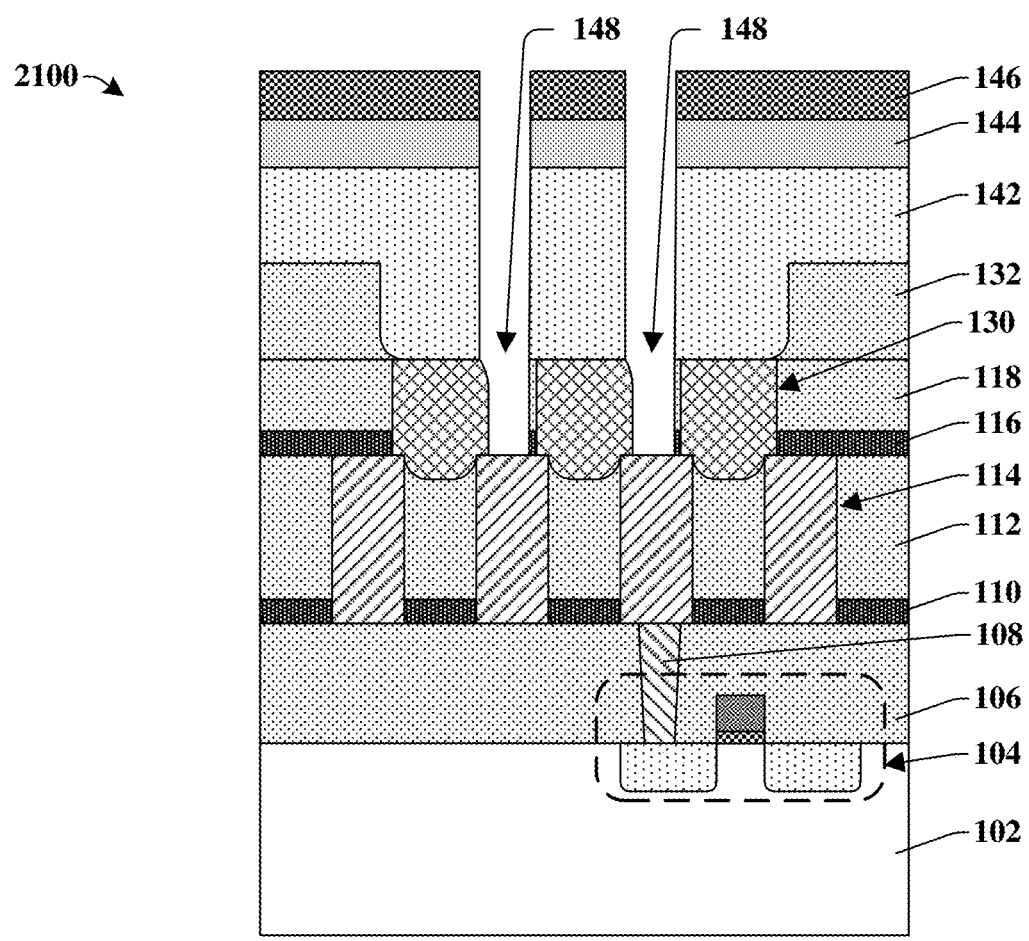

As shown in cross-sectional view 2100 of FIG. 21, the seventh ARC layer 142 and the eighth ARC layer 144 are etched with the fourth photoresist mask 146 in place. In addition, the portions of the second ILD layer 118 that are disposed between the portions of the protective dielectric structure 130 are etched to form a plurality of via openings 148 (i.e., a plurality of second recesses) in the second ILD layer 118 between the portions of the protective dielectric structure 130 and over metal lines of the plurality of lower metal lines 114. Via openings of the plurality of via openings 148 may have a width of about 5 to 300 nanometers. Sidewalls of via openings of the plurality of via openings 148 may be angled at 40 to 90 degrees, as measured from horizontal.

The etches illustrated in FIG. 21 may comprise ICP etching, CCP etching, or remote plasma etching and may utilize methane, fluoromethane, difluoromethane, fluoroform, octafluorocyclobutane, hexafluoro-1,3-butadiene, tetrafluoromethane, hydrogen, hydrogen bromide, carbon monoxide, carbon dioxide, oxygen, Boron trichloride, chlorine, nitrogen, helium, neon, argon, any other suitable etchant, or any combination of the foregoing. The etches may alternatively or additionally comprise a wet etching process that may utilize hydrofluoric acid, nitric acid, acetic acid, hydrochloric acid, phosphoric acid, citric acid, or any combination of the foregoing. The etches may be performed in an atmosphere with a pressure of 0.2 to 120 millitorrs and a temperature of 0 to 100 degrees Celsius. A power utilized during the etches may be about 50 to 3000 watts and a bias voltage applied during the etches may be about 0 to 1200 volts.

In some embodiments, due to a misalignment in the fourth photoresist mask 146, the etch may not remove all of the second ILD layer 118 and the second etch stop layer 116 that exists between the portions of the protective dielectric structure 130.

It will be appreciated that the second ILD layer 118 and the second etch stop layer 116 have higher etch rates than the protective dielectric structure 130 during the etch that forms the plurality of via openings 148. Thus, even if a misalignment of the fourth photoresist mask 146 occurs, the via openings 148 will not extend laterally past the sidewalls of the underlying metal lines because the protective dielectric structure 130 extends over the sidewalls of the underlying metal lines and the low etch rate of the protective dielectric structure 130 allows it to withstand the etch without much of the protective dielectric structure 130 being removed. As a result, over-etching of the second ILD layer 118 into the first ILD layer 112 when forming the via openings 148 may be prevented, thereby preventing a via 150 from being misaligned. By preventing the via 150 from being misaligned, undesirable via formations (e.g., "tiger tooth's") may be prevented. In turn, a potential for undesirable leakage currents or short circuits to occur between electrically isolated metal lines of the plurality of lower metal lines 114 may be reduced, thereby increasing the performance and reliability of the integrated chip.

If, for example, misalignment of the fourth photoresist mask 146 were to occur without the protective dielectric structure 130 in place, the etch that forms the via openings 125 may extend laterally beyond sidewalls of the underlying lower metal lines and vertically into the first ILD layer 112, thereby resulting in misaligned vias (e.g., 174, 172 of FIG. 1B) that may undesirably short electrically isolated lower metal lines. Thus, the protective dielectric structure 130 is implemented in the integrated chip to prevent such undesirable conditions from occurring, thereby increasing the performance and reliability of the integrated chip.

Figure 22:
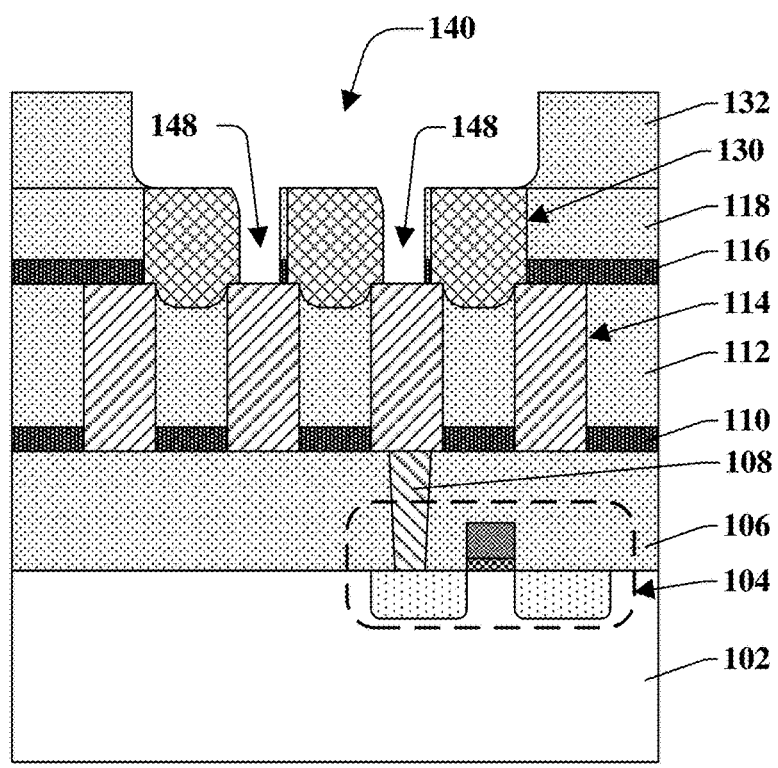

As shown in cross-sectional view 2200 of FIG. 22, the seventh ARC layer 142 and the eighth ARC layer 144 are removed. The removal may comprise one or more etches such as, for example, an ICP etching, CCP etching, remote plasma etching, isotropic chemical etching, or a wet etching process that may utilize hydrofluoric acid, nitric acid, acetic acid, hydrochloric acid, phosphoric acid, citric acid, or any combination of the foregoing.

Figure 23:
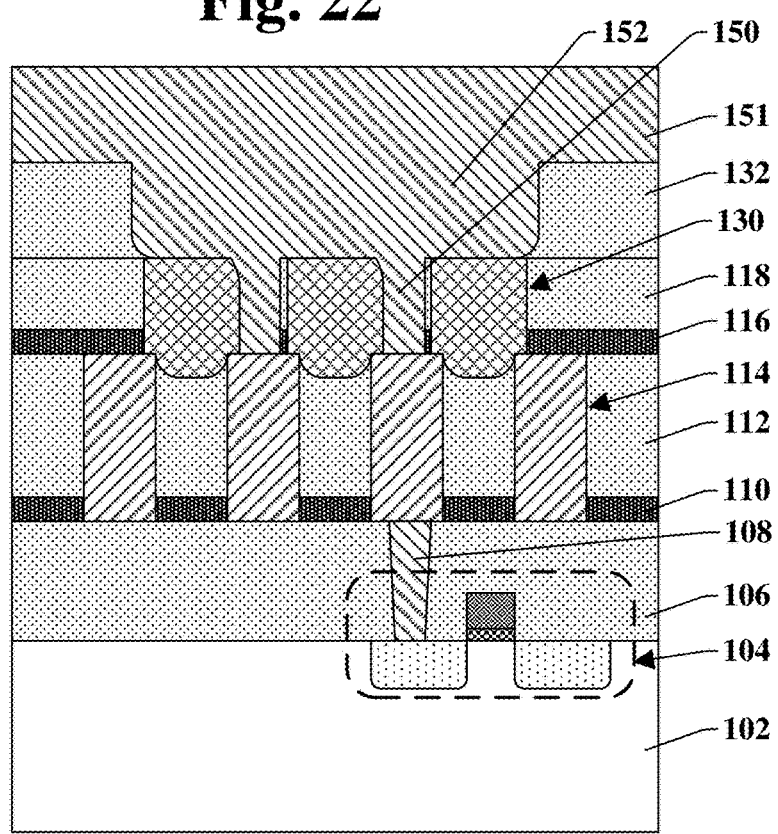

As shown in cross-sectional view 2300 of FIG. 23, a second metal 151 is deposited in the plurality of via openings 148 and in the second trench 140 to form a plurality of vias 150 and an upper metal line 152, respectively. The second metal may be formed by sputtering, electroplating, or another suitable metal deposition technique and, deposition may occur at a temperature of 150 to 400 degrees Celsius.

In some embodiments, the plurality of vias are in contact with the protective dielectric structure 130 along one sidewall. In other embodiments, the plurality of vias may be in contact with the protective dielectric structure 130 along two sidewalls or may not be in contact with the protective dielectric structure 130, depending on whether a portion of the second ILD layer 118 remains in the plurality of via openings 148 after forming the plurality of via openings 148 by etching. Sidewalls of the plurality of vias 150 may be separated from the second ILD layer by the protective dielectric structure 130 after the plurality of vias 150 are formed.

Figure 24:
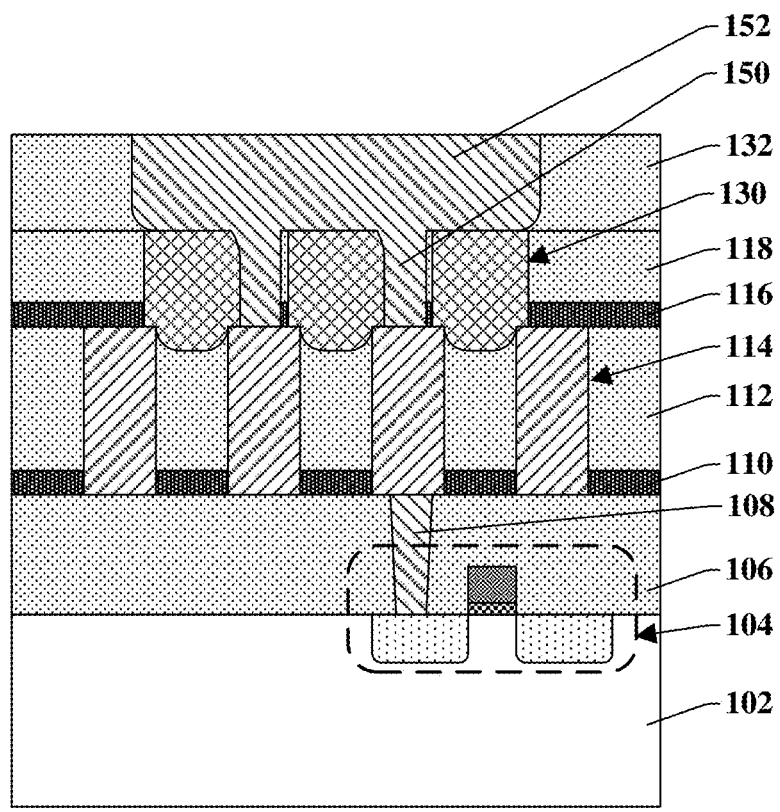

As shown in cross-sectional view 2400 of FIG. 24, a CMP is performed on the upper metal line 152 to bring a top of the upper metal line 152 even with a top of the third ILD layer 132.

Again, by forming the protective dielectric structure 130—which has a lower etch rate than the second ILD layer 118 during the via opening 148 etch—around vias 150, between vias 150, and between metal lines of the plurality of lower metal lines 114, the forming of misaligned vias (e.g., 174, 172 of FIG. 1B) may be prevented. As a result, a potential for undesirable leakage currents or short circuits to occur between electrically isolated vias and lower metal lines may be decreased. In turn, the overall reliability of the integrated circuit may be increased.

Figure 25:
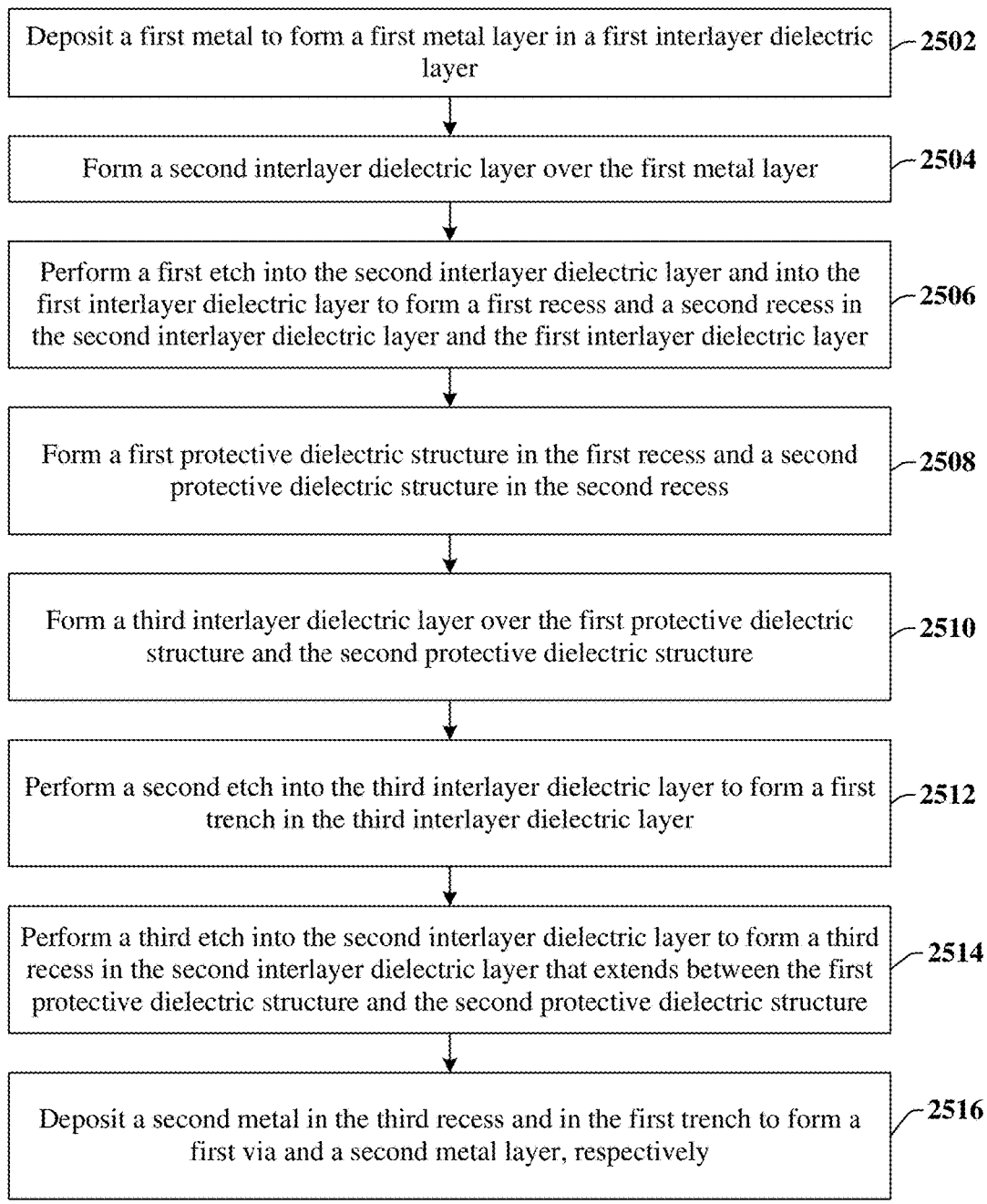
FIG. 25 illustrates a flow diagram of some embodiments of a method for forming an integrated chip comprising a self-aligned interconnect structure.

FIG. 25 illustrates a flow diagram of some embodiments of a method 2500 for forming an integrated chip comprising a self-aligned interconnect structure.

While method 2500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2502, a first metal (e.g., 121) is deposited to form a first metal layer (e.g., 114) in a first interlayer dielectric layer (e.g., 112). See, for example, FIG. 9A.

At 2504, a second interlayer dielectric layer (e.g., 118) is formed over the first metal layer (e.g., 114). See, for example, FIG. 10.

At 2506, a first etch is performed into the second interlayer dielectric layer (e.g., 118) to form a first recess and a second recess (e.g., 126) in the second interlayer dielectric layer. See, for example, FIG. 12.

At 2508, a first protective dielectric structure (e.g., 130) is formed in the first recesses (e.g. 126) and a second protective dielectric structure (e.g., 130) is formed in the second recess (e.g., 126). See, for example, FIGS. 14 and 15.

At 2510, a third interlayer dielectric layer (e.g., 132) is formed over the first protective dielectric structure and over the second protective dielectric structure (e.g., 130). See, for example, FIG. 16.

At 2512, a second etch is performed into the third interlayer dielectric layer (e.g., 132) to form a first trench (e.g., 140) in the third interlayer dielectric layer. See, for example, FIG. 18.

At 2514, a third etch is performed into the second interlayer dielectric layer (e.g., 118) to form a third recess (e.g., 148) in the second interlayer dielectric layer that extends between the first protective dielectric structure and the second protective dielectric structure (e.g., 130). See, for example, FIG. 21.

At 2516, a second metal (e.g., 151) is deposited in the third recess and in the first trench to form a first via (e.g., 150) and a second metal layer (e.g., 152), respectively. See, for example, FIG. 23.

In short, various embodiments of the present disclosure relate to an integrated chip comprising a self-aligned interconnect structure for improving the reliability of the integrated chip and a method for forming the self-aligned interconnect structure.

Accordingly, in some embodiments, the present disclosure relates to a semiconductor structure including an interconnect structure disposed over a semiconductor substrate. The interconnect structure includes a first interlayer dielectric layer disposed at a first height over the semiconductor substrate. A lower metal line is disposed at the first height over the semiconductor substrate and extending laterally along a first axis through the first interlayer dielectric layer. A second interlayer dielectric layer is disposed at a second height over the semiconductor substrate, the second interlayer dielectric layer comprising a first dielectric material and the second height being greater than the first height. A third interlayer dielectric layer is disposed at a third height over the semiconductor substrate, the third height being greater than the second height. An upper metal line is disposed at the third height over the semiconductor substrate, the upper metal line extending laterally through the third interlayer dielectric layer along a second axis perpendicular to the first axis. A via is disposed at the second height. The via extends between an upper surface of the lower metal line and a lower surface of the upper metal line to electrically couple the lower metal line to the upper metal line. In addition, a protective dielectric structure is disposed at the second height. The protective dielectric structure comprises a protective dielectric material and is disposed along a first set of opposing sidewalls of the via, the protective dielectric material differing from the first dielectric material and the first set of sidewalls being in parallel with the first axis.

In other embodiments, the present disclosure relates to a semiconductor structure including an interconnect structure disposed over a semiconductor substrate. The interconnect structure includes first interlayer dielectric layer that is disposed at a first height over the semiconductor substrate. A first lower metal line and a second lower metal line are disposed at the first height over the semiconductor substrate and extending laterally through the first interlayer dielectric layer, the first lower metal line extending in parallel with the second lower metal line in a first direction and spaced apart from the second lower metal line by a first distance measured laterally through the first interlayer dielectric layer. A second interlayer dielectric layer is disposed at a second height over the semiconductor substrate, the second interlayer dielectric layer comprising a first dielectric material and the second height being greater than the first height. A third interlayer dielectric layer is disposed at a third height over the semiconductor substrate, the third height being greater than the second height. An upper metal line is disposed at the third height over the semiconductor substrate, the second metal line extending laterally through the third interlayer dielectric layer in a second direction and crossing over at least one of the first lower metal line and the second lower metal line, the second direction perpendicular to the first direction. A via extends from a lower surface of the upper metal line to an upper surface of the first lower metal line. Finally, a first protective dielectric structure comprising a protective dielectric material is spaced laterally between uppermost portions of nearest neighboring sidewalls of the first lower metal line and the second lower metal line and extending upwardly along a first sidewall of the via, wherein the protective dielectric material differs from the first dielectric material.

In yet other embodiments, the present disclosure relates to a method for forming a semiconductor structure. The method includes depositing a first metal to form a first metal layer in a first interlayer dielectric layer. A second interlayer dielectric layer comprising a first dielectric material is formed over the first metal layer. A first recess and a second recess are formed in the second interlayer dielectric layer. The first recess and the second recess extend through the second interlayer dielectric layer into the first interlayer dielectric layer and extend below an upper surface of the first metal layer. A first protective dielectric structure and a second protective dielectric structure are formed in the first recess and the second recess, respectively, wherein the first protective dielectric structure and the second protective dielectric structure comprise a protective dielectric material different from the first dielectric material. A third interlayer dielectric layer is formed over the first protective dielectric structure and the second protective dielectric structure. A first trench is formed in the third interlayer dielectric layer. The first trench extends through the third interlayer dielectric layer to a top of the first protective dielectric structure and a top of the second protective dielectric structure. A third recess is formed in the second interlayer dielectric layer. The third recess extends through the second interlayer dielectric layer to the first metal layer, wherein the third recess is disposed between the first protective dielectric structure and the second protective dielectric structure. Finally, a second metal is deposited in the third recess and in the first trench to form a first via and a second metal layer, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, the method comprising:
   forming a first metal line in a first dielectric layer and over a substrate;
   depositing a second dielectric layer comprising a first dielectric material over the first dielectric layer and the first metal line;
   forming a first opening and a second opening in the second dielectric layer, the first opening and the second opening extending through the second dielectric layer, into the first dielectric layer on opposite sides of the first metal line, and below a top surface of the first metal line;
   forming a first protective dielectric structure and a second protective dielectric structure in the first opening and the second opening, respectively, wherein the first protective dielectric structure and the second protective dielectric structure comprise a protective dielectric material different from the first dielectric material;
   forming a third opening in the second dielectric layer, the third opening extending through the second dielectric layer to the first metal line and directly between the first protective dielectric structure and the second protective dielectric structure; and
   forming a first metal via in the third opening, the first metal via electrically coupled to the first metal line.

2. The method of claim 1, wherein forming the third opening in the second dielectric layer comprises performing an etch into the second dielectric layer, wherein the first dielectric material has a higher etch rate than the protective dielectric material during the etch.

3. The method of claim 1, wherein the first opening is delimited by a first sidewall of the second dielectric layer and the second opening is delimited by a second sidewall of the second dielectric layer, and wherein both the first sidewall and the second sidewall are directly over the top surface of the first metal line.

4. The method of claim 1, wherein a portion of the second dielectric layer is disposed directly over the first metal line and directly between the first protective dielectric structure and the second protective dielectric structure after forming the first protective dielectric structure and the second protective dielectric structure in the first opening and the second opening.

5. The method of claim 4, wherein forming the third opening comprises removing, at least in part, the portion of the second dielectric layer from directly over the first metal line and directly between the first protective dielectric structure and the second protective dielectric structure.

6. The method of claim 1, further comprising:
   forming a second metal line in the first dielectric layer and laterally spaced apart from the first metal line, wherein the second opening extends directly between the first metal line and the second metal line.

7. The method of claim 6, wherein the second opening extends directly over the first metal line and directly over the second metal line.

8. The method of claim 1, wherein forming the first protective dielectric structure and the second protective dielectric structure comprises depositing the protective dielectric material in the first opening and the second opening, directly over the first dielectric layer, directly over the second dielectric layer, and directly over the first metal line.

9. The method of claim 1, wherein the third opening is delimited by the top surface of the first metal line, a sidewall of the first protective dielectric structure, and a sidewall of the second dielectric layer.

10. A method for forming a semiconductor structure, the method comprising:
    forming a first metal line and a second metal line in a first dielectric layer and over a substrate, wherein the first metal line and the second metal line are laterally spaced apart by the first dielectric layer;
    depositing a second dielectric layer comprising a first dielectric material over the first dielectric layer, the first metal line, and the second metal line;
    forming a first opening in the second dielectric layer, the first opening extending through the second dielectric layer, into the first dielectric layer, below a top surface of the first metal line and a top surface of the second metal line, and directly between the first metal line and the second metal line;
    forming a first protective dielectric structure comprising a protective dielectric material, different from the first dielectric material, in the first opening;
    forming a second opening in the second dielectric layer on a first side of the first protective dielectric structure, the second opening extending through the second dielectric layer to the first metal line; and
    forming a first metal via in the second opening, the first metal via electrically coupled to the first metal line.

11. The method of claim 10, wherein forming the second opening in the second dielectric layer comprises etching the second dielectric layer on the first side of the first protective dielectric structure, wherein the first dielectric material has a quicker etch rate than the protective dielectric material during the etching.

12. The method of claim 10, wherein the first opening is delimited by a first sidewall and a second sidewall of the second dielectric layer, and wherein the first sidewall is directly over the top surface of the first metal line and the second sidewall is directly over the top surface of the second metal line.

13. The method of claim 10, wherein the first opening is delimited by an upper surface of the first dielectric layer, wherein the upper surface of the first dielectric layer extends from the first metal line to the second metal line.

14. The method of claim 10, wherein forming the first opening comprises etching the second dielectric layer and the first dielectric layer to remove portions of the second dielectric layer and the first dielectric layer from between the first metal line and the second metal line.

15. The method of claim 10, wherein the second opening is delimited by a first sidewall of the first protective dielectric structure.

16. A method for forming a semiconductor structure, the method comprising:
   forming a first metal line and a second metal line in a first dielectric layer and over a substrate, wherein the first metal line and the second metal line are laterally spaced apart by the first dielectric layer, and wherein the first dielectric layer comprises a first dielectric;
   depositing a second dielectric over the first dielectric layer to form a second dielectric layer over the first dielectric layer, the first metal line, and the second metal line;
   etching the second dielectric layer and the first dielectric layer to form a first opening in the second dielectric layer and the first dielectric layer, the first opening extending through the second dielectric layer, into the first dielectric layer, below a top surface of the first metal line and a top surface of the second metal line, and directly between the first metal line and the second metal line;
   depositing a protective dielectric, different than the second dielectric, over the second dielectric layer and in the first opening to form a first protective dielectric structure directly between sidewalls of the second dielectric layer and directly between the first metal line and the second metal line;
   etching the second dielectric layer to form a second opening in the second dielectric layer, the second opening extending through the second dielectric layer to the first metal line; and
   depositing a metal in the second opening and on the top surface of the first metal line to form a first metal via on the top surface of the first metal line and adjacent to the first protective dielectric structure.

17. The method of claim 16, further comprising:
   performing a planarization process on the protective dielectric after depositing the protective dielectric to remove the protective dielectric from directly over a top surface of the second dielectric layer.

18. The method of claim 16, wherein etching the second dielectric layer and the first dielectric layer to form the first opening uncovers a portion of the top surface of the first metal line and a portion of the top surface of the second metal line.

19. The method of claim 16, further comprising:
   depositing a third dielectric layer over the second dielectric layer and the first protective dielectric structure before etching the second dielectric layer to form the second opening; and
   etching the third dielectric layer to form a trench in the third dielectric layer and directly over the first metal line before etching the second dielectric layer to form the second opening.

20. The method of claim 16, wherein etching the second dielectric layer to form the second opening removes a portion of the first protective dielectric structure.

\* \* \* \* \*